US012074109B2

(12) United States Patent
Badaroglu et al.

(10) Patent No.: US 12,074,109 B2
(45) Date of Patent: Aug. 27, 2024

(54) TRENCH POWER RAIL IN CELL CIRCUITS TO REDUCE RESISTANCE AND RELATED POWER DISTRIBUTION NETWORKS AND FABRICATION METHODS

(71) Applicant: QUALCOMM Incorporated, San Diego, CA (US)

(72) Inventors: Mustafa Badaroglu, Leuven (BE); Zhongze Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 355 days.

(21) Appl. No.: 17/648,981

(22) Filed: Jan. 26, 2022

(65) Prior Publication Data
US 2023/0238325 A1    Jul. 27, 2023

(51) Int. Cl.
*H01L 23/528*    (2006.01)
*H01L 21/762*    (2006.01)
(Continued)

(52) U.S. Cl.
CPC .... *H01L 23/5286* (2013.01); *H01L 21/76224* (2013.01); *H01L 21/823871* (2013.01); *H01L 21/823878* (2013.01); *H01L 23/5223* (2013.01); *H01L 23/5226* (2013.01); *H01L 23/5283* (2013.01); *H01L 27/092* (2013.01)

(58) Field of Classification Search
CPC ........... H01L 23/5286; H01L 21/76224; H01L 21/823871; H01L 21/823878; H01L 23/5223; H01L 23/5226; H01L 23/5283; H01L 27/092; H01L 21/76831; H01L 23/485; H01L 27/0207
See application file for complete search history.

(56) References Cited

U.S. PATENT DOCUMENTS

| | | | |
|---|---|---|---|
| 9,041,148 B2 | 5/2015 | Jakushokas et al. | |
| 2014/0367757 A1* | 12/2014 | Jakushokas | H01L 28/60 |
| | | | 257/306 |
| 2020/0235098 A1 | 7/2020 | Li et al. | |

FOREIGN PATENT DOCUMENTS

WO    2014201415 A1    12/2014

OTHER PUBLICATIONS

International Search Report and Written Opinion for International Patent Application No. PCT/US2022/080485, mailed Mar. 3, 2023, 12 pages.

* cited by examiner

*Primary Examiner* — Karen Kusumakar
*Assistant Examiner* — Adam S Bowen
(74) *Attorney, Agent, or Firm* — W&T/Qualcomm Incorporated

(57) ABSTRACT

An integrated circuit includes a trench power rail to reduce resistance in a power rail or avoid an increase in resistance of a power rail as a result of the metal tracks being reduced in size as the technology node size is reduced. The trench power rail is formed in isolation regions between cell circuits. A cell isolation trench in the isolation region provides additional volume in which to dispose additional metal material for forming the trench power rail to increase its cross-sectional area. The trench power rail extends through a via layer to a metal layer, including signal interconnects. The trench power rail extends in a width direction out of the cell isolation trench in the via layer to couple to trench contacts of the adjacent cell circuits without vertical interconnect accesses (vias). A high-K dielectric layer can selectively isolate the trench power rail from the cell circuits.

19 Claims, 12 Drawing Sheets

(51) Int. Cl.
*H01L 21/8238* (2006.01)
*H01L 23/522* (2006.01)
*H01L 27/092* (2006.01)

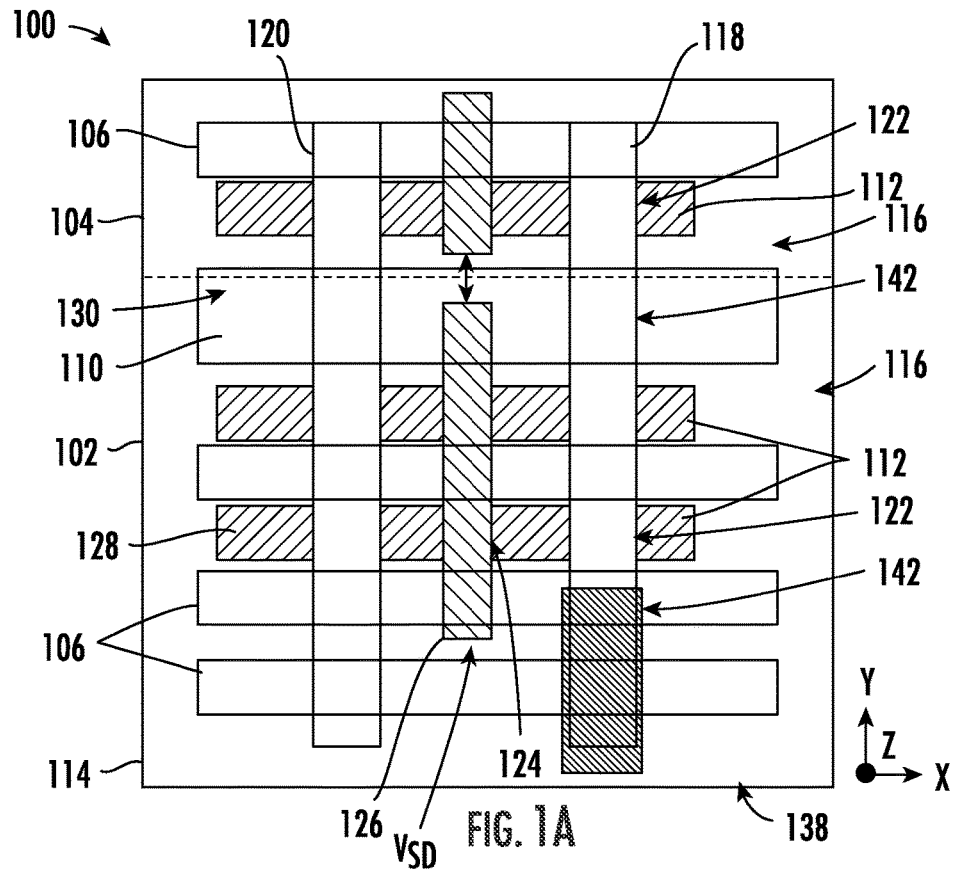
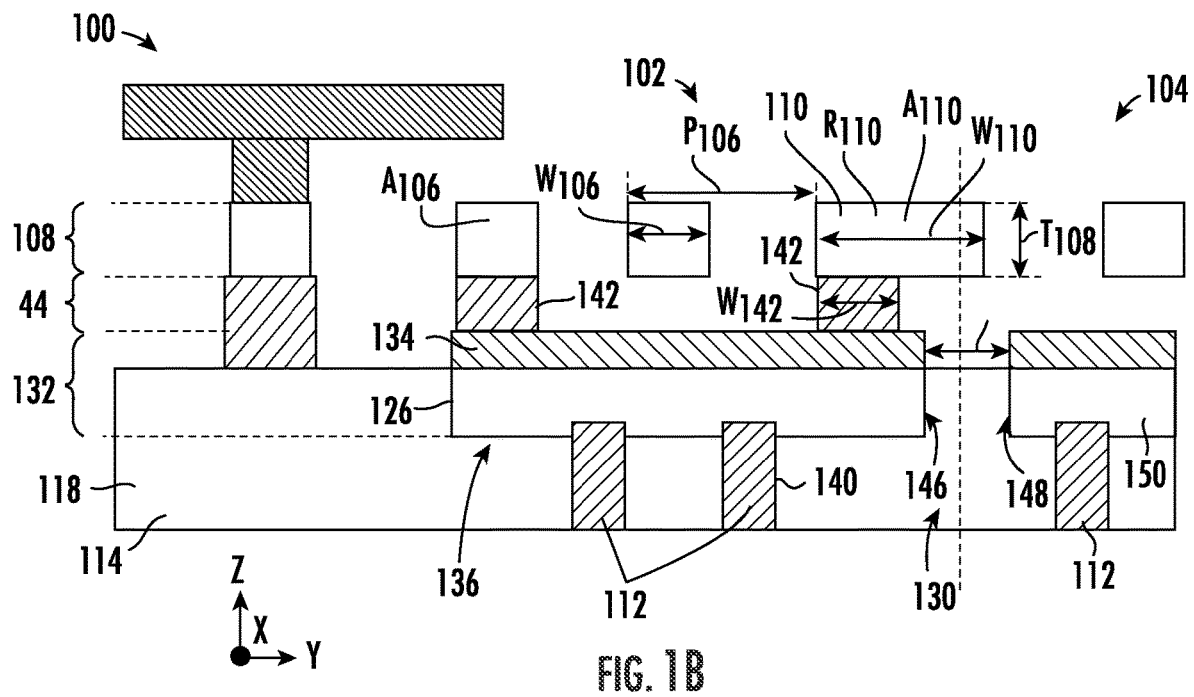
FIG. 1B

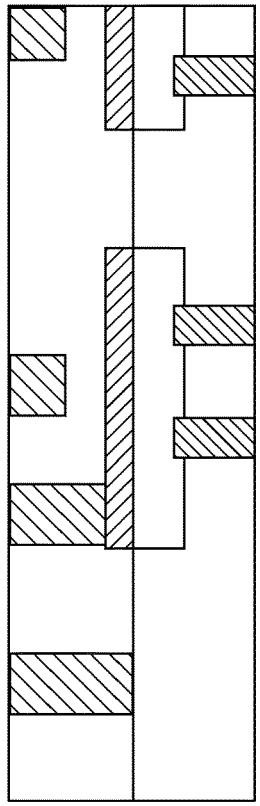

FIG. 12A

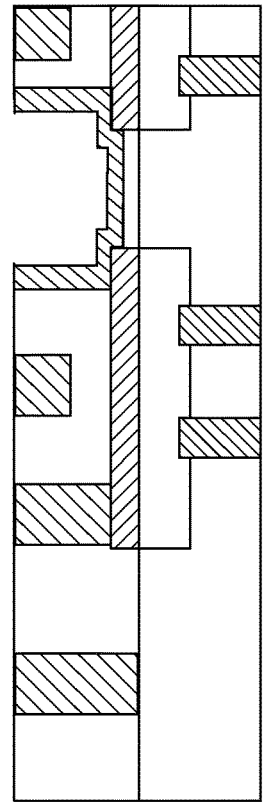

FIG. 12B

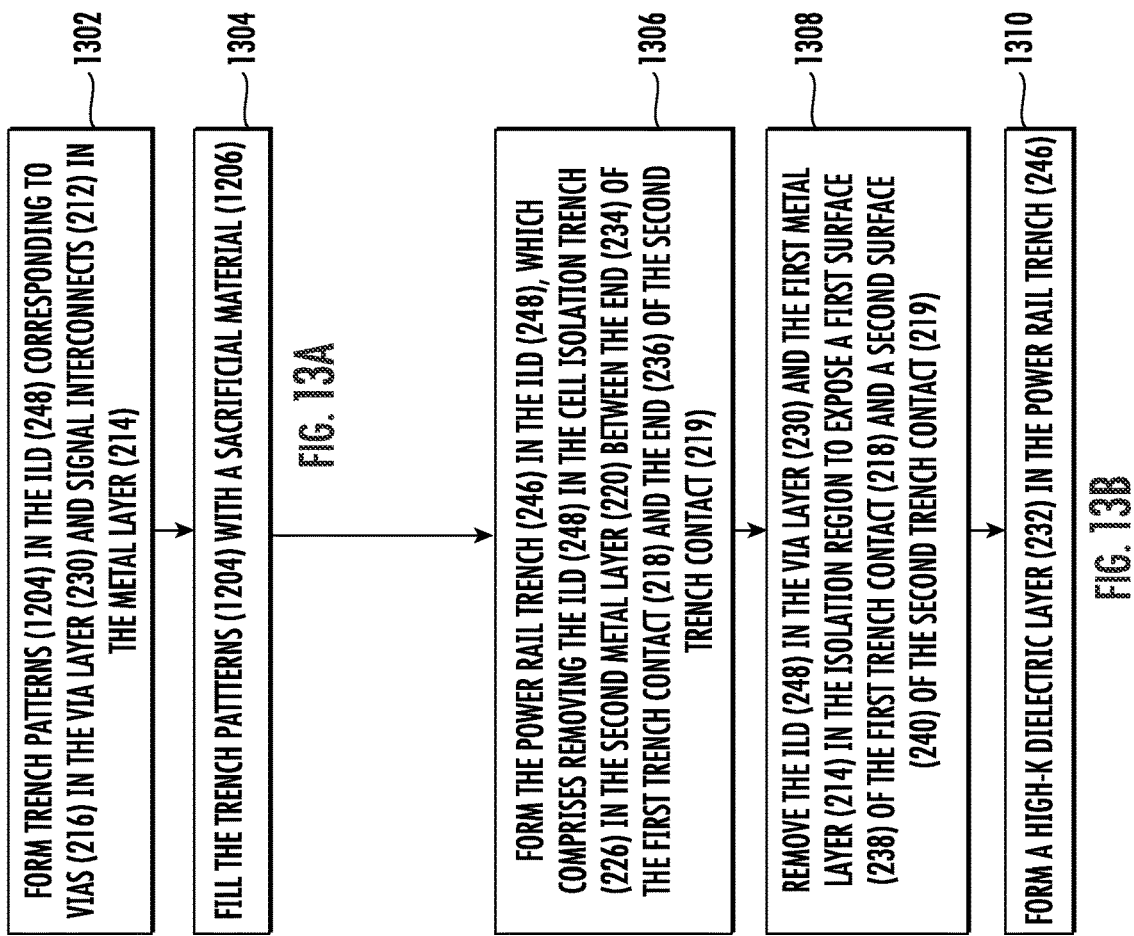

1302 — FORM TRENCH PATTERNS (1204) IN THE ILD (248) CORRESPONDING TO VIAS (216) IN THE VIA LAYER (230) AND SIGNAL INTERCONNECTS (212) IN THE METAL LAYER (214)

1304 — FILL THE TRENCH PATTERNS (1204) WITH A SACRIFICIAL MATERIAL (1206)

FIG. 13A

1306 — FORM THE POWER RAIL TRENCH (246) IN THE ILD (248), WHICH COMPRISES REMOVING THE ILD (248) IN THE CELL ISOLATION TRENCH (226) IN THE SECOND METAL LAYER (220) BETWEEN THE END (234) OF THE FIRST TRENCH CONTACT (218) AND THE END (236) OF THE SECOND TRENCH CONTACT (219)

1308 — REMOVE THE ILD (248) IN THE VIA LAYER (230) AND THE FIRST METAL LAYER (214) IN THE ISOLATION REGION TO EXPOSE A FIRST SURFACE (238) OF THE FIRST TRENCH CONTACT (218) AND A SECOND SURFACE (240) OF THE SECOND TRENCH CONTACT (219)

1310 — FORM A HIGH-K DIELECTRIC LAYER (232) IN THE POWER RAIL TRENCH (246)

FIG. 13B

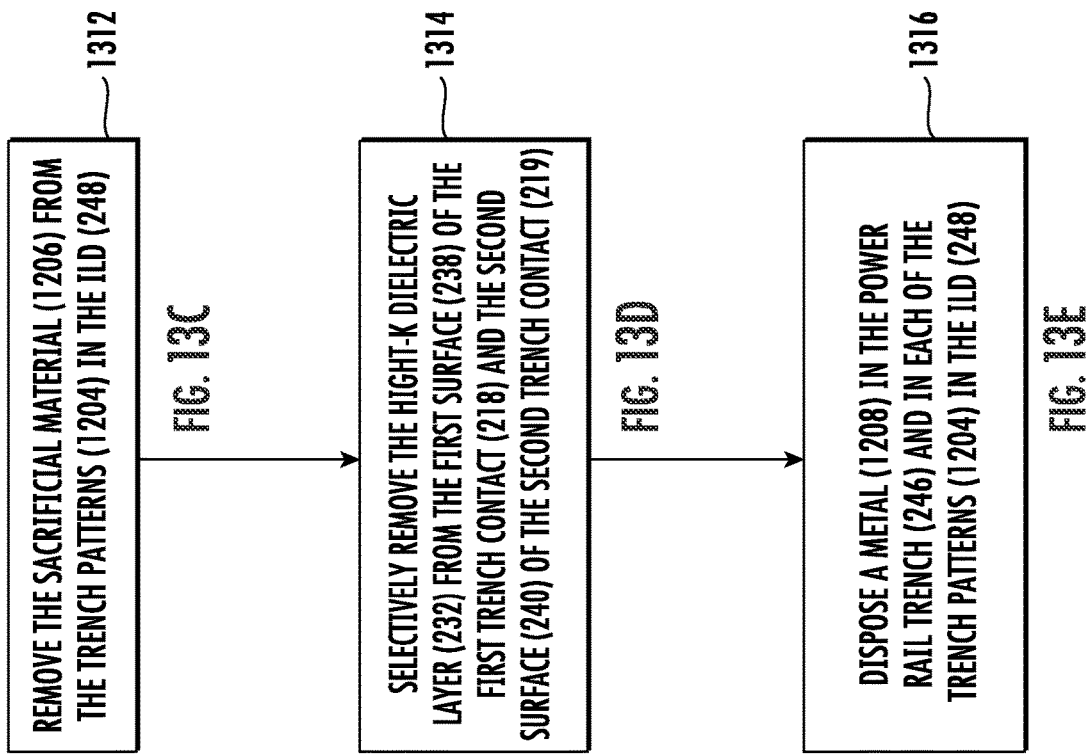
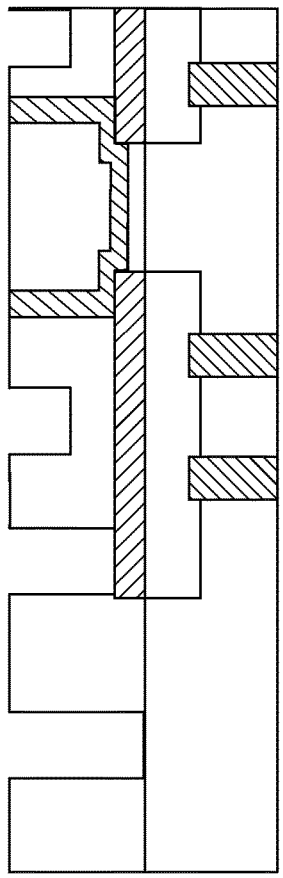
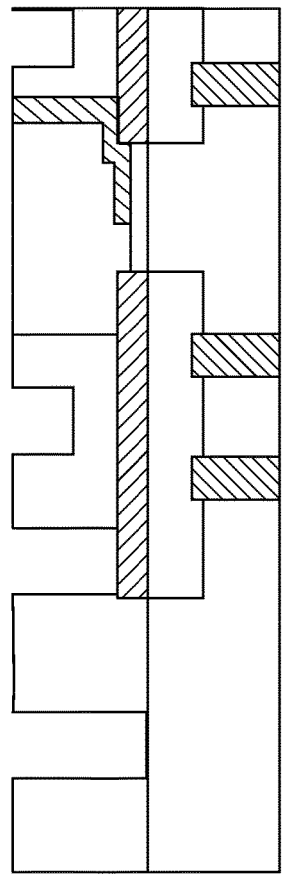
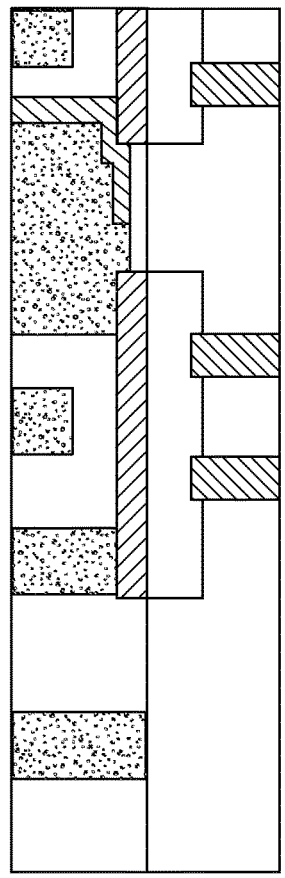

TRENCH POWER RAIL IN CELL CIRCUITS TO REDUCE RESISTANCE AND RELATED POWER DISTRIBUTION NETWORKS AND FABRICATION METHODS

BACKGROUND

I. Field of the Disclosure

The field of the disclosure relates generally to power rails in integrated circuits (ICs), and in particular, to distribution of a supply voltage and ground connections to standard cell circuits.

II. Background

Integrated circuits (ICs) used in electronic devices continually tend to be smaller in size to fit more functionality into a smaller volume, reduce power consumption, and reduce cost. The circuits integrated into a single die can include millions of transistors on a semiconductor surface. Transistors in ICs are implemented as standard cell circuits in standard cells having a uniform layout on the semiconductor surface to increase area efficiency. The transistors are interconnected by signal interconnects provided in metal layers above the semiconductor surface to form desired circuits. The respective metal layers are separated from each other in the vertical direction by via layers. Vertical interconnect accesses (vias) in the via layers provide vertical connections between the metal interconnects in the respective metal layers.

Power is provided to the standard cell circuits as a supply voltage (e.g., $V_{DD}$) on a supply voltage power rail and at a ground voltage (e.g., $V_{SS}$) on a ground voltage power rail of a power distribution network. The supply voltage power rail and ground voltage power rail are formed in a metallization layer that also includes signal interconnects that convey signals among the standard cells. The power rail extends beyond a given cell circuit and extends to multiple adjacent cell circuits to supply power to such circuits. Thus, the overall current flowing through a power rail is greater than a current level in the signal interconnects as a result of current dividing. To reduce power loss in the power rails due to Joule heating (e.g., "$I^2R$ drop"), the power rails are made larger in cross-section than the signal interconnects. Since a metallization layer in which the power rails are formed has a uniform thickness, a larger cross-section is obtained by making the power rails wider than the signal interconnects. However, the widths of power rails contribute to the total area of an IC.

Voltage fluctuations between the supply voltage on a supply voltage power rail and the ground voltage on a ground voltage power rail are distributed to the standard cells. Such fluctuations (e.g., noise) in power-to-ground voltage can cause standard cell circuits to operate improperly, leading to soft errors in the IC. Decoupling capacitors are provided between the supply voltage power rail and the ground voltage power rail in power distribution networks to reduce such noise. Since the frequencies of noise protection provided by a decoupling capacitor reduces with the increasing resistance in rails and protection from high-frequency noise are needed in wireless devices, decoupling capacitors having a large capacitance with a high-quality factor (e.g., having a lower series resistance) is preferred. However, decoupling capacitors may require more area to achieve a larger capacitance, which also contributes to the total area of an IC.

SUMMARY OF THE DISCLOSURE

Exemplary aspects disclosed in the detailed description include a trench power rail in cell circuits to reduce resistance and related power distribution networks. Related methods of making trench power rails are also disclosed. An integrated circuit (IC) includes cell circuits (also referred to as "cells") formed in cell areas in a circuit cell on a semiconductor substrate. The circuit cells may be standard cells that include P-type and N-type material diffusion regions for forming P-type metal-oxide-semiconductor (PMOS) and N-type metal-oxide-semiconductor (NMOS) transistors for forming logic circuits. The cell circuits in the circuit cells are isolated from each other by a cell isolation trench in an isolation region between adjacent circuit cells, but the cell circuits are coupled to each other by signal interconnects extending horizontally in metal tracks in metal layers above the semiconductor substrate. The metal layers can also include power rails for providing power to the cell circuits. In exemplary aspects, to reduce resistance of a power rail in the circuit cells or avoid an increase in resistance of a power rail as a result of the metal tracks being reduced in size as the technology node size is reduced, a power rail is formed as a trench power rail in the power rail track and the cell isolation trench. The cell isolation trench provides additional volume in which to dispose additional metal material for forming the power rail to increase its cross-sectional area, thereby reducing its resistance. The trench power rail also extends through a via layer between the power rail track and the cell isolation trench. The power rail extends out of the cell isolation trench in the via layer to couple to trench contacts of the adjacent circuit cells. As a result, a vertical interconnect access (via) is not needed in the via layer between the first metal layer and the trench contact to couple the power rail to the trench contact. In some exemplary aspects, a high-K dielectric layer, such as hafnium oxide, zirconium oxide, or aluminum oxide, is disposed in the cell isolation trench between the trench contact(s) and the power rail to isolate the power rail from one or both of the circuit cells on either side of the cell isolation trench.

In other exemplary aspects, a trench decoupling capacitor in a power distribution network of an IC includes at least a first trench rail coupled to the supply voltage and at least a second trench rail coupled to the ground voltage. The first trench rail and the second trench rail are separated from each other by a high-K dielectric layer. In some examples, a trench rail of a decoupling capacitor extends through a first metal layer, a via layer, and into a cell isolation trench layer on a semiconductor substrate. One or more of the trench decoupling capacitors disposed among the circuit cells reduces noise in the power distribution network.

In exemplary aspects, an integrated circuit (IC) is disclosed herein. The IC comprises a first cell circuit comprising a first trench contact disposed in a first metal layer, the first trench contact extending along a first longitudinal axis in a first direction. The IC comprises a second cell circuit comprising a second trench contact disposed in the first metal layer, the second trench contact extending along a second longitudinal axis in the first direction. The IC also comprises a cell isolation trench in an isolation region between a first end of the first trench contact and a second end of the second trench contact. The IC comprises a second metal layer adjacent the first metal layer in a second direction, a first thickness of the second metal layer extending in the second direction. The IC further comprises a via layer between the first metal layer and the second metal layer, a second thickness of the via layer extending in the second direction. The IC also comprises a trench power rail in the cell isolation trench, the trench power rail extending along a third longitudinal axis in a third direction, a thickness of the trench power rail comprising the first thickness of the second metal layer, the second thickness of the via layer, and a third thickness in the first metal layer.

In another exemplary aspect, an IC is disclosed. The IC comprises a first power rail and a second power rail, the first power rail and the second power rail extending in a first direction in a first metal layer. The IC also comprises a decoupling capacitor comprising a first trench capacitor rail extending in the first direction. The decoupling capacitor also comprises a second trench capacitor rail extending in the first direction adjacent to the first trench capacitor rail. The decoupling capacitor also comprises a first dielectric layer disposed between the first trench capacitor rail and the second trench capacitor rail. The decoupling capacitor also comprises a first trench contact extending in a second direction in the first metal layer and coupling the first trench capacitor rail to the first power rail. The decoupling capacitor further comprises a second trench contact extending in the second direction in the first metal layer and coupling the second trench capacitor rail to the second power rail.

In another exemplary aspect, a method of manufacturing an integrated circuit (IC) is disclosed. The method comprises forming a first cell circuit comprising a first trench contact disposed in a first metal layer, the first trench contact extending along a first longitudinal axis in a first direction, and forming a second cell circuit comprising a second trench contact disposed in the first metal layer, the second trench contact extending along a second longitudinal axis in the first direction. The method also comprises forming a cell isolation trench in an isolation region between a first end of the first trench contact and a second end of the second trench contact and forming a second metal layer adjacent to the first metal layer in a second direction, a first thickness of the second metal layer extending in the second direction. The method further comprises forming a via layer between the first metal layer and the second metal layer, a second thickness of the via layer extending in the second direction; and forming a trench power rail in the cell isolation trench, the trench power rail extending along a third longitudinal axis in a third direction, a thickness of the trench power rail comprising the first thickness of the second metal layer, the second thickness of the via layer, and a third thickness in the first metal layer.

BRIEF DESCRIPTION OF THE FIGURES

FIGS. 1A and 1B are a layout view and a cross-sectional side view, respectively, illustrating signal interconnects in metal tracks in a metal layer in cell circuits (e.g., standard cells) and a power rail track in the metal layer overlapping an isolation region between the circuit cells;

FIG. 12A is a cross-sectional side view in a first stage of fabrication of circuit cells showing sacrificial placeholders for signal interconnects in a metal layer, and FIG. 13A is a first block of a flowchart describing the corresponding stage of fabrication;

FIG. 12B is a cross-sectional side view in a second stage of fabrication in which a trench is formed for a trench power rail in an isolation region between circuit cells, and a high-K dielectric layer is formed in the trench, and FIG. 13B is a first block of a flowchart describing the corresponding stage of fabrication;

FIG. 12C is a cross-sectional side view in a third stage of fabrication in which the sacrificial placeholders are removed, and FIG. 13C is a first block of a flowchart describing the corresponding stage of fabrication;

FIG. 12D is a cross-sectional side view in a fourth stage of fabrication in which the high-K dielectric is patterned, and FIG. 13D is a first block of a flowchart describing the corresponding stage of fabrication; and FIG. 12E is a cross-sectional side view in a fifth stage of fabrication in which signal interconnects and a trench power rail are formed in a metallization process, and FIG. 13E is a first block of a flowchart describing the corresponding stage of fabrication;

DETAILED DESCRIPTION

Figure 2A:
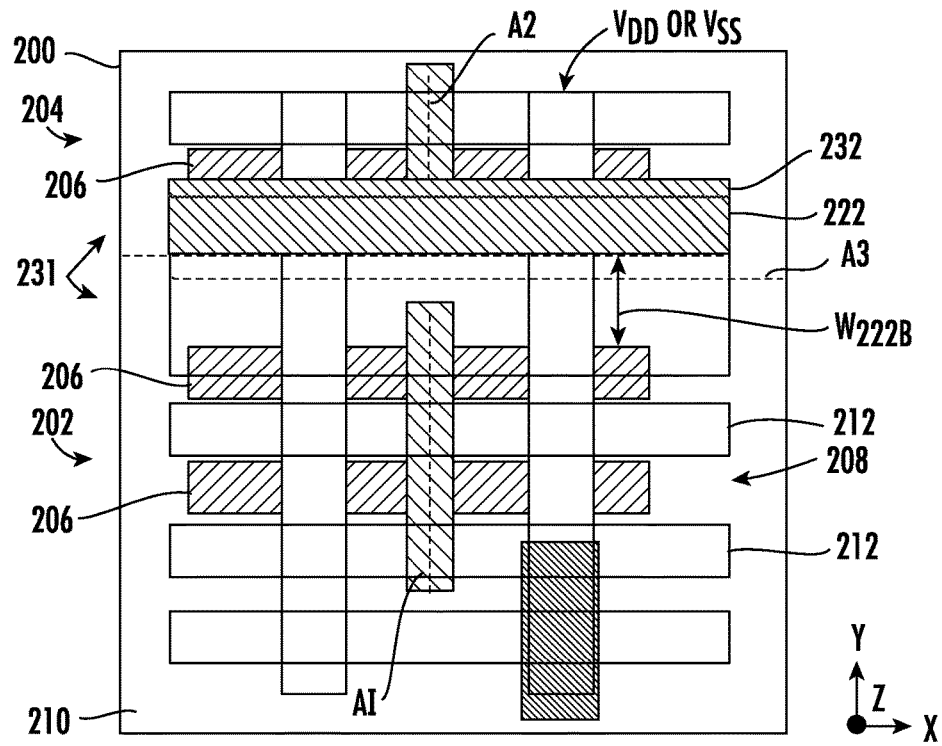
FIGS. 2A and 2B are a layout view and a cross-sectional side view, respectively, of an integrated circuit (IC) including circuit cells including diffusion regions coupled to signal interconnects disposed in a metal layer, and an exemplary trench power rail extending across an isolation region between adjacent circuit cells to reduce resistance and to couple to cell circuits without vias.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Exemplary aspects disclosed in the detailed description include a trench power rail in cell circuits to reduce resistance and related power distribution networks. Related methods of making trench power rails are also disclosed. An integrated circuit (IC) includes cell circuits (also referred to as "cells") formed in cell areas in a circuit cell on a semiconductor substrate. The circuit cells may be standard cells that include P-type and N-type material diffusion regions for forming P-type metal-oxide-semiconductor (PMOS) and N-type metal-oxide-semiconductor (NMOS) transistors for forming logic circuits. The cell circuits in the circuit cells are isolated from each other by a cell isolation trench in an isolation region between adjacent circuit cells, but the cell circuits are coupled to each other by signal interconnects extending horizontally in metal tracks in metal layers above the semiconductor substrate. The metal layers can also include power rails for providing power to the cell circuits. In exemplary aspects, to reduce resistance of a power rail in the circuit cells or avoid an increase in resistance of a power rail as a result of the metal tracks being reduced in size as the technology node size is reduced, a power rail is formed as a trench power rail in the power rail track and the cell isolation trench. The cell isolation trench provides additional volume in which to dispose additional metal material for forming the power rail to increase its cross-sectional area, thereby reducing its resistance. The trench power rail also extends through a via layer between the power rail track and the cell isolation trench. The power rail extends out of the cell isolation trench in the via layer to couple to trench contacts of the adjacent circuit cells. As a result, a vertical interconnect access (via) is not needed in the via layer between the first metal layer and the trench contact to couple the power rail to the trench contact. In some exemplary aspects, a high-K dielectric layer is disposed in the cell isolation trench between the trench contact(s) and the power rail to isolate the power rail from one or both of the circuit cells on either side of the cell isolation trench.

Before describing the exemplary aspects illustrated in FIGS. 2A-15, FIGS. 1A and 1B provide a top layout view and a cross-sectional side view, respectively, of an integrated circuit (IC) 100 for reference in the following description of features of a first cell circuit 102 and a second cell circuit 104 ("cell circuits 102, 104"). A limited number of the features of the first cell circuit 102 and the second cell circuit 104 are shown here, as needed. The cell circuits 102, 104 may be standard cell circuits that are interconnected by signal interconnects 106 in a metal layer 108. The cell circuits 102, 104 receive one of a supply voltage $V_{DD}$ and a reference voltage $V_{SS}$ on a power rail 110. The cell circuits 102, 104 each also include diffusion regions 112 of a semiconductor substrate 114 to form transistors 116. The signal interconnects 106 can be configured to couple the transistors 116 in respective cell circuits 102, 104 with other cell circuits (not shown) on the IC 100 to achieve a desired circuit functionality.

The diffusion regions 112 are fin-type diffusion regions 112, which can also be a gate-all-around device such as nanosheets, on the semiconductor substrate 114. Gate 118 and gate 120 (e.g., polysilicon gates) are disposed on channel regions 122 of the diffusion regions 112 to control (e.g., allow or disallow) current flow through the diffusion regions 112, and a voltage $V_{SD}$ can be provided to a source/drain region 124 of the diffusion region 112 through a trench contact 126. For example, a transistor 116 can function as a switch controlled by a voltage $V_{GATE}$ on the gate 118 to allow the voltage $V_{SD}$ provided to the trench contact 126 to be passed to the drain/source region 128 of the diffusion region 112. The voltage $V_{SD}$ can be received on one of the signal interconnects 106 (e.g., from an external circuit) or, as in the example shown in FIG. 1, can be a supply voltage (e.g., $V_{DD}$) or a reference voltage (e.g., $V_{SS}$) received from the power rail 110.

Referring to the layout view in FIG. 1A, the signal interconnects 106 and the power rail 110 extend in an X-axis direction in the metal layer 108. The power rail 110 overlaps an isolation region 130 between the first cell circuit 102 and the second cell circuit 104. The diffusion regions 112 extend in an X-axis direction on the semiconductor substrate 114 and intersect the gates 118 and the trench contact 126 that extend in a Y-axis direction. The gates 118 are disposed on the semiconductor substrate 114 and extend over the diffusion regions 112 in a Z-axis direction. The trench contact 126 in cell circuit 102 is formed in a metal layer 132 and couples to the diffusion regions 112. The trench contact 126 is formed by depositing metal 134 (e.g., copper) in a trench 136 in an inter-layer dielectric (ILD) 138 on the semiconductor substrate 114. In contrast to the gates 118, which are electrically isolated from the diffusion regions 112 by a gate dielectric layer 140, the trench contact 126 is directly coupled to the diffusion regions 112 to provide electrical connections to the source/drain regions 124. The trench contact 126 in the metal layer 132 is coupled to the signal interconnects 106 in the metal layer 108 by vertical interconnect accesses (vias) 142 formed in a via layer 144 between the metal layer 108 and the metal layer 132.

As technology progresses from one technology node to the next, some of the features of the cell circuits 102, 104 become smaller while others become bottlenecks to such reduction. For example, the signal interconnects 106 disposed in the metal layer 108 each have a width $W_{106}$ based on a metal track pitch $P_{106}$ in the Y-axis direction in the example shown here and also in the X-axis direction, and the width $W_{106}$ is reduced in each new generation. Consequently, a cross-sectional area $A_{106}$ of the signal interconnects 106 is reduced, which causes resistance in the signal interconnects 106 to increase. Similarly, a width $W_{142}$ of vias is reduced in both the X-axis direction and the Y-axis direction, which increases resistance of connections between the metal layer 108 and the metal layer 132.

Since the power rail 110 is employed to power multiple cell circuits 102, 104, which can require significantly more current than a signal in the signal interconnects 106, the power rail 110 has a larger cross-sectional area than the signal interconnects 106 to reduce resistance. Since the signal interconnects 106 and the power rail 110 are formed in the same metal layer 108, having a thickness $T_{108}$, a width $W_{110}$ of the power rail 110 is made larger than the width $W_{106}$ of the signal interconnects 106 to increase a cross-sectional area $A_{110}$ of the power rail 110. However, from one technology node to the next, even the width dimension $W_{110}$ is reduced, reducing the cross-sectional area $A_{110}$ and causing the resistance $R_{110}$ of the power rail 110 to increase.

As noted above, the power rail 110 overlaps an isolation region 130 between the first cell circuit 102 and the second cell circuit 104. The isolation region 130 is based on a minimum tip-to-tip distance $D_{T2T}$ between an end 146 of the trench contact 126 in first cell circuit 102 to an end 148 of a trench contact 150 in the second cell circuit 104. The minimum tip-to-tip distance $D_{T2T}$ is a design rule based on manufacturing tolerances to reduce short defects between the cell circuits 102, 104. In addition, the trench contact 126 is extended in the Y-axis direction from the diffusion region 112 to reach a landing area $A_{VIA}$ beneath the power rail 110 for the via 142 to couple the power rail 110 to the trench contact 126. Thus, the isolation region 130 and the trench contact landing area $A_{VIA}$ are an aspect of the cell circuits 102, 104 that is difficult to reduce.

Figure 2B:
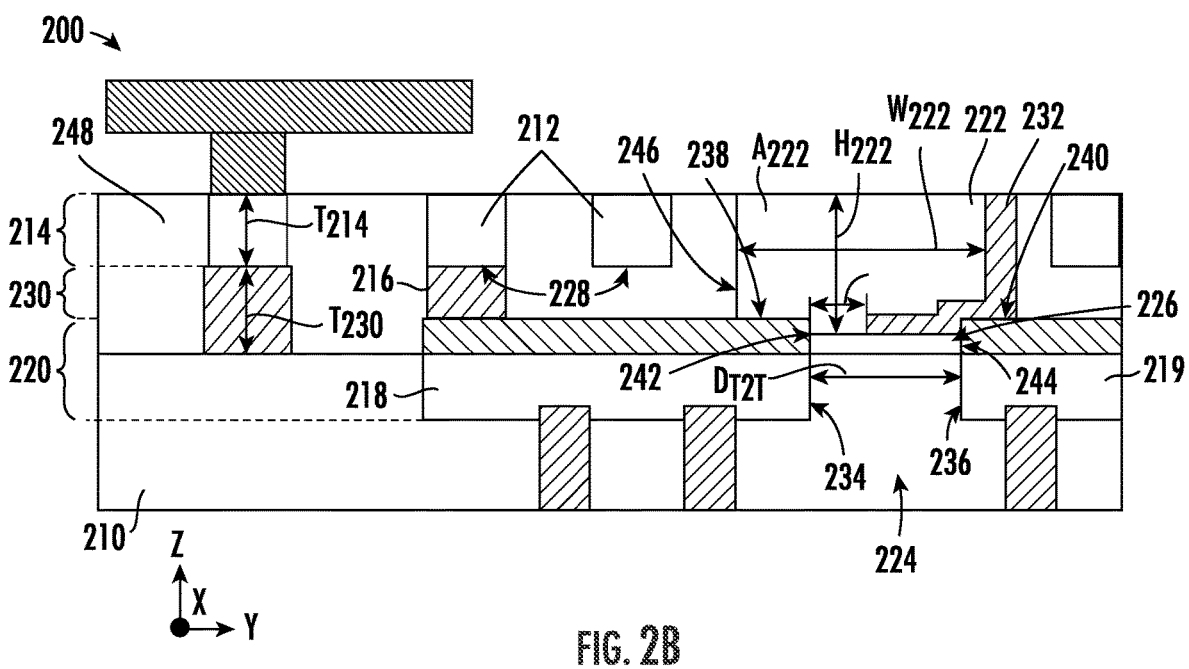

FIGS. 2A and 2B are a layout view and a cross-sectional side view, respectively, of an IC 200 including a first cell circuit 202 and a second cell circuit 204 ("cell circuits 202, 204") including diffusion regions 206 of transistors 208 formed in a semiconductor substrate 210. The transistor 208 of the cell circuit 202 is coupled to the second cell circuit 204 and to external circuits (not shown) by signal interconnects 212 in a metal layer 214 and by vias 216. One of the vias 216 extends between a first trench contact 218 in a metal layer 220 and the metal layer 214. An exemplary trench power rail 222 extends along an isolation region 224 between the cell circuits 202, 204. The trench power rail has a width $W_{222B}$ (e.g., in a Y-axis direction) extending across the isolation region 224 and a height $H_{222}$ (e.g., in a Z-axis direction) extending from the metal layer 214 into a cell isolation trench 226 to reduce resistance in the trench power rail 222 and to provide power to the cell circuits 202, 204 without the vias 216. As described further below, the trench power rail 222 can be formed in all of metal layer 220 in the cell isolation trench 226, in the via layer 230, and in the metal layer 214 as a monolithic metal layer formed in a single stage of a process. The trench power rail 222 may be part of a power distribution network (not shown) within the IC 200, and reducing the resistance of the trench power rail 222 may improve a quality factor (Q factor) of the IC 200.

The cell circuits 202, 204 are formed in circuit cells 231 and isolated from each other by the cell isolation trench 226 in the isolation region 224. The cell circuits 202, 204 can be coupled to each other by the signal interconnects 212 extending horizontally (e.g., in an X-axis, Y-axis plane) in metal tracks 228 in the metal layer 214 above the semiconductor substrate 210. The cell isolation trench 226 provides additional volume in which to dispose metal for the trench power rail 222 to increase its cross-sectional area $A_{222}$. Employing the trench power rail 222 as disclosed herein can reduce resistance in the provision of power to the cell circuits 202, 204 compared to existing power rails (such as power rail 110 in FIG. 1, which is limited to the thickness $T_{108}$ of the metal layer 108), and avoid increasing resistance as a result of the metal tracks 228 being reduced in width with new technology nodes. The trench power rail 222 extends through a via layer 230 in which the vias 216 are formed between the metal layer 214 and the metal layer 220 in which the first trench contact 218 is formed. The trench power rail 222 extends out of the cell isolation trench 226 in the Y-axis direction in the via layer 230 to couple to the first trench contact 218 of the first cell circuit 202 and second trench contact 219 of the second cell circuit 204, which are on opposite sides of the trench power rail 222. As a result, a via 216 is not needed to couple the first trench contact 218 to the trench power rail 222. A high-K dielectric layer 232 may be disposed in the cell isolation trench 226 between the trench contacts 218, 219 and the trench power rail 222 to isolate the trench power rail 222 from one or both the trench contacts 218, 219. As shown in FIG. 2B, the high-K dielectric layer 232 may be disposed on the second trench contact 219 to electrically isolate the second trench contact 219 from the trench power rail 222, but the high-K dielectric layer 232 is not disposed on the first trench contact 218 so the trench power rail 222 can provide one of the supply voltage $V_{DD}$ and the reference voltage $V_{SS}$ (e.g., ground or 0 volts) to the first trench contact 218.

With further reference to FIGS. 2A and 2B, the cell circuits 202, 204 correspond to the cell circuits 102, 104 in FIG. 1 except as described below. The first cell circuit 202 includes the first trench contact 218 in the metal layer 214 and extending along a first longitudinal axis A1 in the Y-axis direction. The second cell circuit 204 includes the second trench contact 219 disposed in the metal layer 220 and extending along a second longitudinal axis A2 in the Y-axis direction. The axis A1 may be colinear with the axis A2. The cell isolation trench 226 is disposed in the isolation region 224 between an end 234 of the first trench contact 218 and a second end 236 of the second trench contact 219. The metal layer 220 is adjacent to the metal layer 214 in the Z-axis direction and has a thickness $T_{214}$ extending in the Z-axis direction. The via layer 230 is between the metal layer 220 and the metal layer 214 and has a thickness $T_{230}$ extending in the Z-axis direction. The trench power rail 222 extending along a longitudinal axis A3 in the X-axis direction, a thickness $T_{222}$ of the trench power rail 222 includes the thickness $T_{214}$ of the metal layer 214, the thickness $T_{230}$ of the via layer 230, and a thickness $T_{226}$ in the metal layer in the cell isolation trench 226.

The trench power rail 222 can provide a supply voltage $V_{DD}$ or a reference (e.g., ground) voltage $V_{SS}$, for example. The trench power rail 222 extending across the isolation region 224 in the Y-axis direction and having the height $H_{222}$ provides the large cross-sectional area $A_{222}$ for current to provide power to the cell circuits 202, 204. As shown in FIG. 2B, the trench power rail 222 extends in the Y-axis direction onto surface 238 on a side of the first trench contact 218 adjacent to the via layer 230 and on a surface 240 on the side of the second trench contact 219 adjacent to the via layer 230. The trench power rail 222 can be disposed directly onto a large area of one, both, or neither of the surfaces 238, 240, in addition to being in contact with end faces 242 and 244, respectively of the trench contacts 218, 219. In this manner, the trench contacts 218, 219 have low resistance electrical contact to the trench power rail 222. Alternatively, the trench power rail 222 may be disposed indirectly on the first trench contact 218 and/or the second trench contact 219, which includes being disposed on the high-K dielectric layer 232, which may be selectively disposed on the surfaces 238, 240, 242, and 244 of the trench contacts 218, 219.

Since the trench power rail 222 can be directly disposed on the end 234 of the trench contact 218, no via landing area is needed. Thus, the trench contact 218 does not need to extend as far in the Y-axis direction from the diffusion region 206 as the trench contact 126 in FIG. 1. The trench power rail 222 enables a reduction in a dimension of the first cell circuit 202 in the Y-axis direction while still maintaining the minimum tip-to-tip distance $D_{T2T}$ (between the end 234 and the end 236) required to meet manufacturing design rules. In addition, whereas existing power rails may have increased resistance due to a via cross-sectional area becoming smaller, the exemplary trench power rail 222 avoids the need for vias and thus avoids the corresponding resistance in new technology nodes.

In further detail, the trench power rail 222 disposed between the end 234 of the first trench contact 218 and the end 236 of the second trench contact 219 has a first width $W_{222A}$ in the metal layer 220 in the Y-axis direction that is less than or equal to the tip-to-tip distance $D_{T2T}$. Here, the width $W_{222A}$ is less than the tip-to-tip distance $D_{T2T}$ because the high-K dielectric layer 232 is formed on the second trench contact 219. Since the trench power rail 222 extends onto the surfaces 238, 240, the trench power rail 222 width $W_{222B}$ in the Y-axis direction in the via layer 230 is greater than the tip-to-tip distance $D_{T2T}$. The trench power rail 222 also has the second width $W_{222B}$ in the Y-axis direction also in the metal layer 214. The second width $W_{222B}$ may be determined by a width $W_{306}$ of a power rail trench 246 formed in an inter-layer dielectric (ILD) 248, as described further below. The second width $W_{222B}$ also depends on patterning of the high-K dielectric layer 232.

Figure 3:
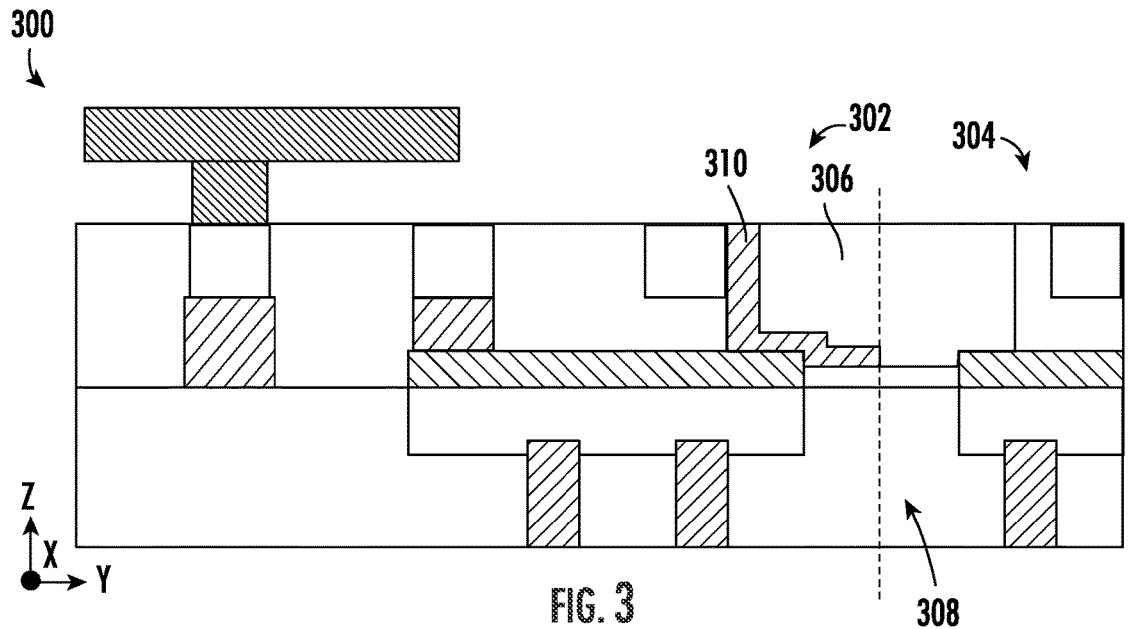
FIG. 3 is a cross-sectional side view of a trench power rail in an isolation region between circuit cells and coupled to a cell circuit on a second side of the trench power rail.

FIG. 3 is a cross-sectional side view of an IC 300 including cell circuits 302 and 304 corresponding to the cell circuits 202 and 204 in the IC 200 in FIG. 2 except that a trench power rail 306 in FIG. 3, in an isolation region 308 between cell circuits 302 and 304, is coupled to the cell circuit 304 and not coupled to the cell circuit 302. FIG. 3 is provided to show a different pattern of a high-K dielectric layer 310 than is shown in FIG. 2 to show that the trench power rail 306 may be configured to be coupled to one of the cell circuits 302 and 304 on either side of the isolation region 308.

Figure 4:
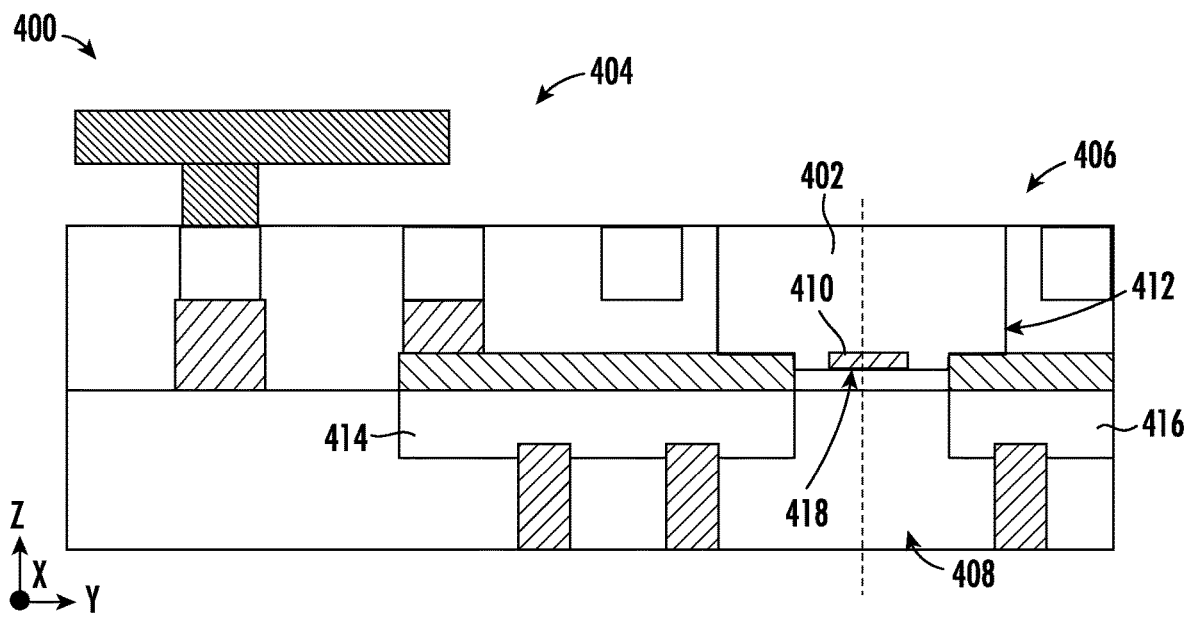
FIG. 4 is a cross-sectional side view of a trench power rail in an isolation region between circuit cells and coupled to the cell circuit on both sides of the trench power rail.

FIG. 4 is a cross-sectional side view of another example of an IC 400 in which a trench power rail 402 is coupled to cell circuits 404 and 406 on both sides of an isolation region 408. In this regard, a high-K dielectric layer 410 may be formed (e.g., by deposition) in a trench 412 and patterned to remove portions of the high-K dielectric layer 410 on a trench contact 414 and/or a trench contact 416. FIG. 4 includes a residual portion 418 of a high-K-dielectric layer 410 remaining in the isolation region 408 after being patterned.

Figure 5:
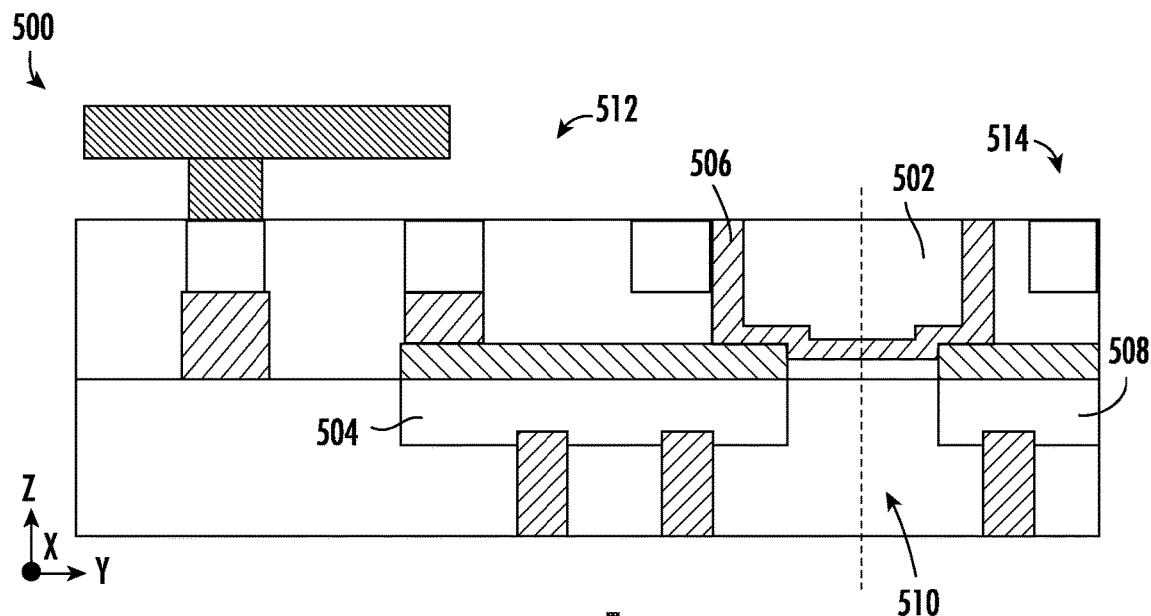
FIG. 5 is a cross-sectional side view of a trench power rail in an isolation region between circuit cells in which the cell circuits are not coupled to the trench power rail.

FIG. 5 is a cross-sectional side view of an IC 500 corresponding to FIGS. 2B, 3, and 4, in which a trench power rail 502 is isolated from trench contact 504 by a high-K dielectric layer 506 and isolated from the trench contact 508 by the high-K dielectric layer 506, which are on opposite sides of an isolation region 510. FIG. 5 is provided to show that the trench power rail 502, which does not rely on vias for connection to the trench contacts 504 and 508, may be routed through an isolation region 510 between cell circuits 512 and 514 without being electrically coupled to the cell circuits 512 and 514.

Figure 6:
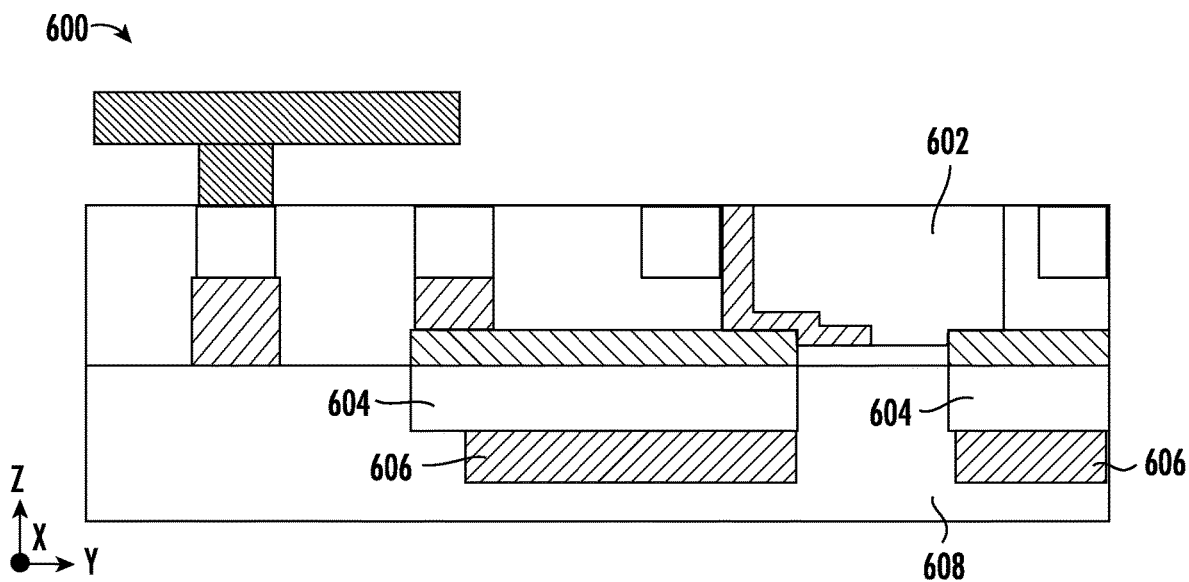
FIG. 6 is a cross-sectional side view of an IC corresponding to FIG. 2B but including a trench power rail and trench contacts coupled to planar diffusion regions.

FIG. 6 is a cross-sectional side view of an IC 600 corresponding in many aspects to the IC 200 in FIG. 2B but is provided to illustrate that a trench power rail 602 as described above can be employed in the IC 600 including trench contacts 604 coupled to planar diffusion regions 606 formed on a semiconductor substrate 608.

Figure 7:
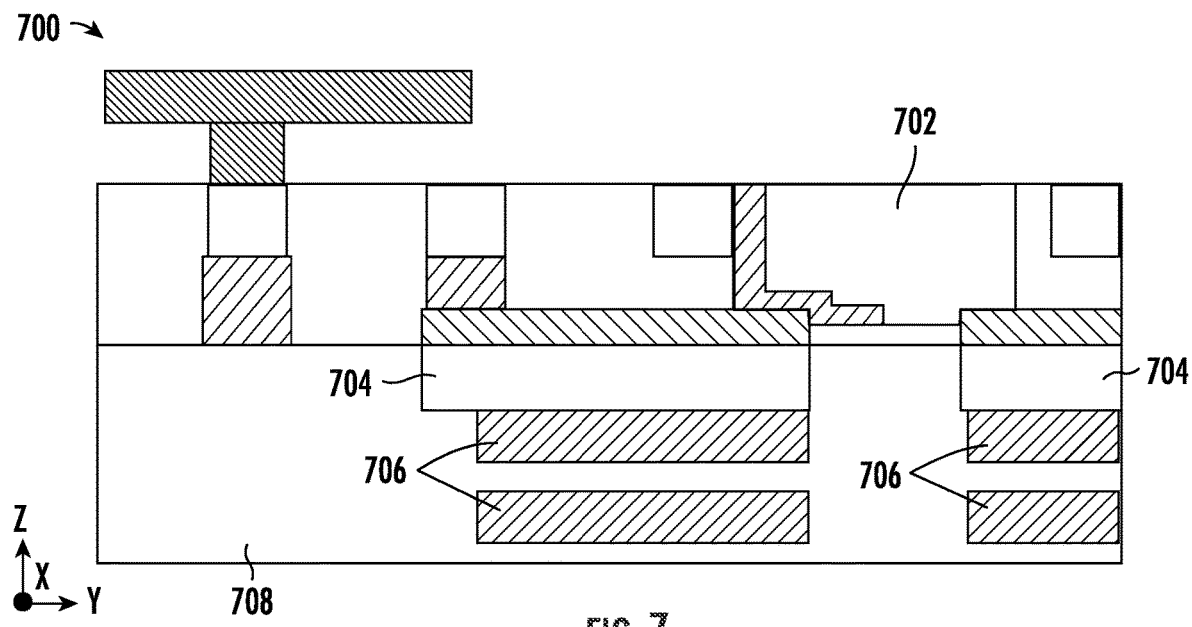
FIG. 7 is a cross-sectional side view of an IC corresponding to FIG. 2B but including a trench power rail and trench contacts coupled to gate-all-around (GAA) diffusion regions.

FIG. 7 is a cross-sectional side view of an IC 700 corresponding to FIG. 2B and provided to illustrate that a trench power rail 702 as described above can be employed in the IC 700 including trench contacts 704 coupled to gate-all-around (GAA) diffusion regions 706 formed on a semiconductor substrate 708.

Figure 8:
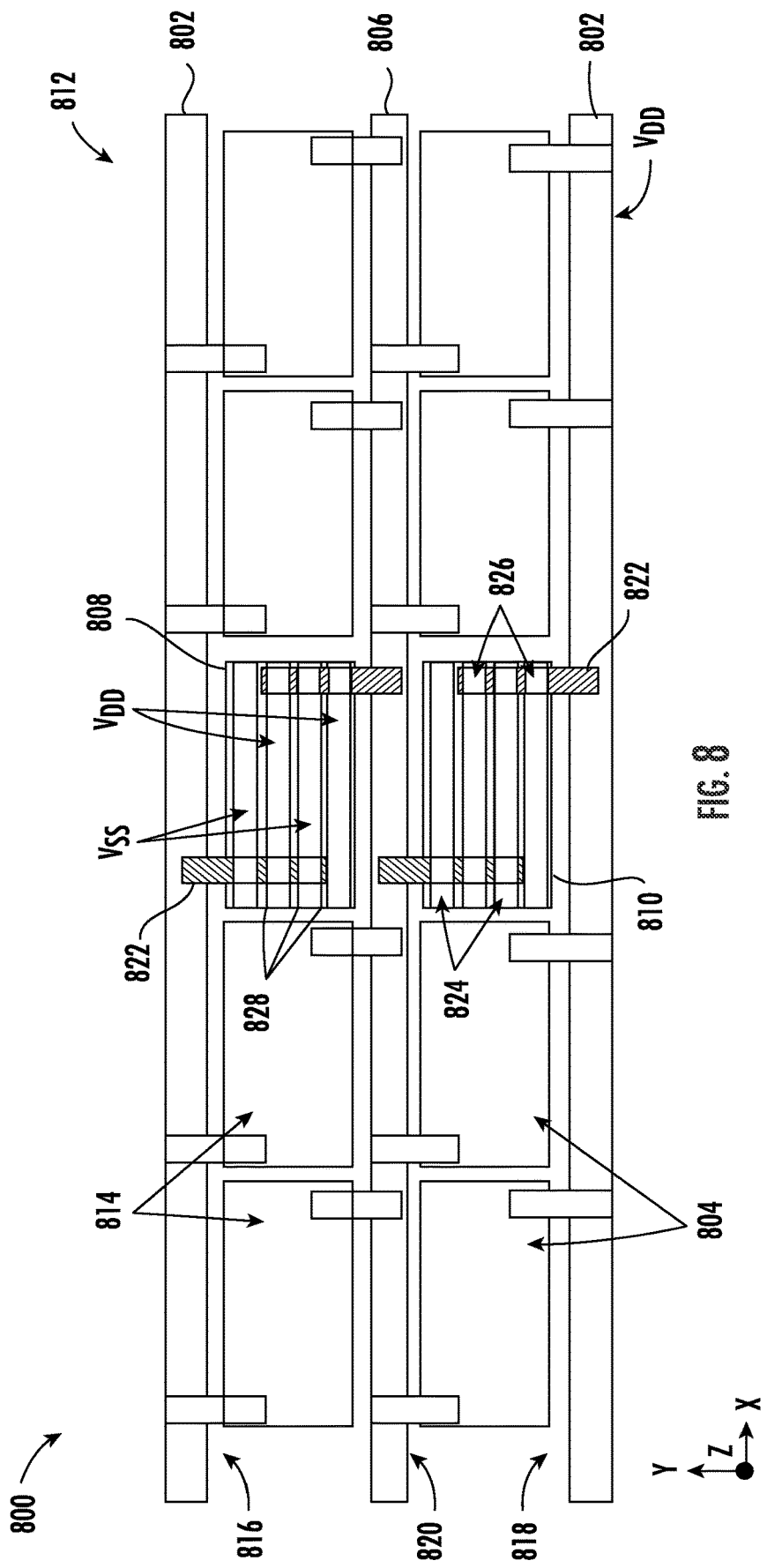
FIG. 8 is a top layout view of an integrated circuit including trench power rails disposed in isolation regions between circuit cells and decoupling capacitors coupled to the trench power rails to reduce noise in a supply voltage, the decoupling capacitors comprising multiple adjacent trench rails in a circuit cell area.

FIG. 8 is a top layout view of an IC 800 including trench power rails 802 for providing a supply voltage $V_{DD}$ to a plurality of cell circuits 804 and trench power rail 806 for providing a reference voltage $V_{SS}$ to the plurality of cell circuits 804. The cell circuits 804 may be any of the cell circuits 202, 204 in FIG. 2. The IC 800 includes, in an exemplary aspect, decoupling capacitors 808 and 810 coupled to the trench power rails 802 and 806 to reduce noise between the supply voltage $V_{DD}$ and the reference voltage $V_{SS}$ in the IC 800. The plurality of cell circuits 804 are disposed in an array 812 of circuit cell areas 814. The trench power rails 802 extending in an X-axis direction along isolation regions 816 and 818 and the trench power rail 806 extends along an isolation region 820. The cell circuits 804 can be coupled to the trench power rails 802 and 806 by trench contacts 822.

The decoupling capacitors 808 and 810 are formed in two of the circuit cell areas 814 between the trench power rail 806 and one of the trench power rails 802. In some examples, the IC 800 may contain more or fewer than the decoupling capacitors 808 and 810. The decoupling capacitors 808 and 810 each include first trench capacitor rails 824 coupled to the trench power rail 806, providing the reference voltage $V_{SS}$. The decoupling capacitors 808 and 810 each also include second trench capacitor rails 826 coupled to one of the trench power rails 802, providing the supply voltage $V_{DD}$. In each of the decoupling capacitors 808 and 810, the first trench capacitor rails 824 and the second trench capacitor rails 826 are disposed in an alternating order in the Y-axis direction with a high-K dielectric layer 828 disposed between adjacent trench power rails. A capacitance is developed between the first trench capacitor rails 824 and the second trench capacitor rails 826, and such capacitance reduces noise, such as voltage spikes in the supply voltage $V_{DD}$ relative to the reference voltage $V_{SS}$, which can cause cell circuits 804 to operate improperly. Decoupling capacitors 808, 810 located in close proximity to the cell circuits 804 can provide a higher level of noise protection (e.g., high Q factor) than decoupling capacitors external to the IC 800. Although the decoupling capacitors 808, 810 each include two of the first trench capacitor rails 824 and two of the second trench capacitor rails 826, the decoupling capacitors 808, 810 are not limited in this regard and may include more or fewer of the first trench capacitor rails 824 and the second trench capacitor rails 826.

Figure 9:
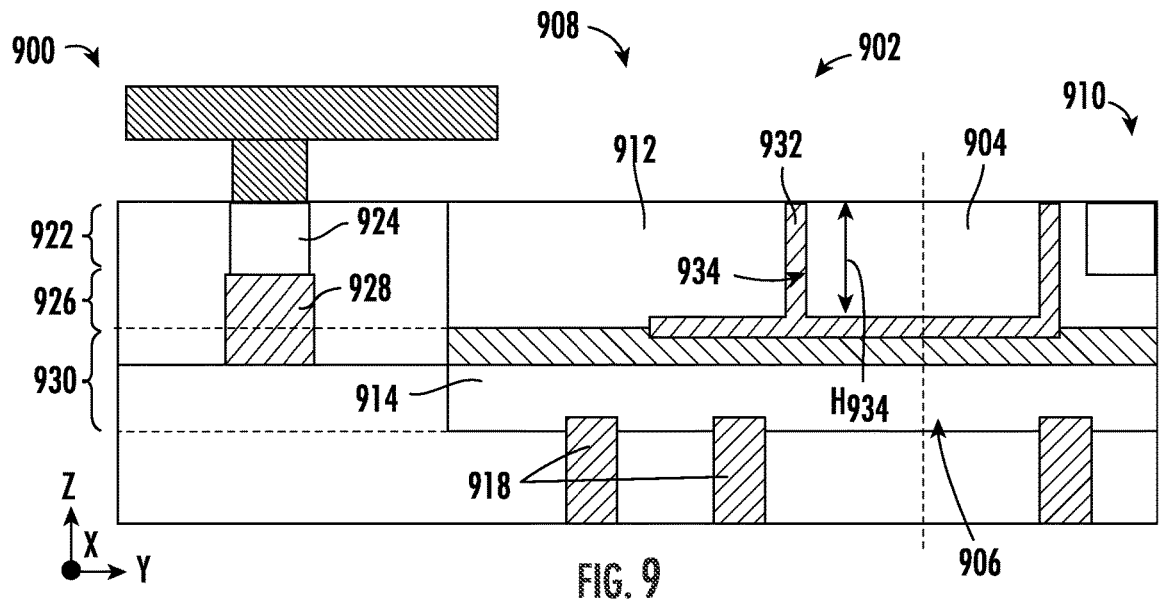
FIG. 9 is a cross-sectional side view of an IC including a decoupling capacitor including a trench power rail in an isolation region between circuit cells and an adjacent trench rail disposed in a circuit cell area.

FIG. 9 is a cross-sectional side view of an IC 900, including a decoupling capacitor 902, including a trench power rail 904 in an isolation region 906 between circuit cell areas 908 and 910. The decoupling capacitor 902 also includes a trench capacitor rail 912 disposed in the circuit cell area 908 adjacent to the trench power rail 904. In the cross-sectional view in FIG. 9, a trench contact 914 extends (e.g., in the Y-axis direction) from the circuit cell area 908 to the circuit cell area 910 through the isolation region 906 to couple one of the supply voltage $V_{DD}$ and the reference voltage $V_{SS}$ from the trench capacitor rail 912 to a cell circuit (not shown) in the circuit cell area 910. The circuit cell area 908 includes diffusion regions (e.g., fins) 918 coupled to the trench contact 914 but the diffusion regions 918 may or may not be used in a cell circuit because the decoupling capacitor 902 occupies the circuit cell area 908.

Each of the trench power rail 904 and the trench capacitor rail 912 are disposed in a metal layer 922, including signal interconnects 924, in a via layer 926 including via 928, and in a metal layer 930 in which the trench contact 914 is formed (e.g., on either side of the trench contact 914 in the X-axis direction). A high-K dielectric layer 932 is disposed on a side wall 934 of the trench power rail 904 between the side wall 934 and the trench capacitor rail 912. A capacitance is developed at the high-K dielectric layer 932 between the side wall 934 of the trench power rail 904 and the trench capacitor rail 912. The capacitance of the decoupling capacitor 902 depends in part on an area defined by a height $H_{934}$ of the side wall 934 and the length (not shown) of the trench capacitor rail 912 and the trench power rail 904. In addition, the high-K dielectric layer 932 extends between the trench power rail 904 and the trench contact 914, adding to the capacitance of the decoupling capacitor 902.

Figure 10:
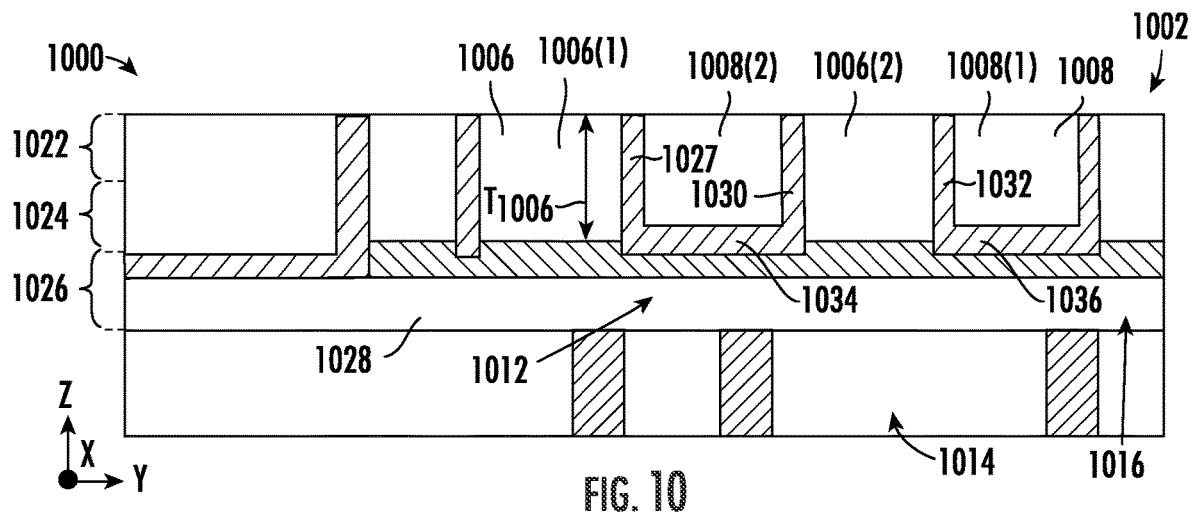
FIG. 10 is a cross-sectional side view of an IC including a decoupling capacitor including multiple adjacent trench capacitor rails in a circuit cell area and an isolation region between circuit cells.

FIG. 10 is a cross-sectional side view of an IC 1000 including a decoupling capacitor 1002 including first trench capacitor rails 1006 coupled to a first one of the supply voltage $V_{DD}$ and the reference voltage $V_{SS}$, and second trench capacitor rails 1008 coupled to the other one of the reference voltage $V_{SS}$ and the supply voltage $V_{DD}$. The first trench capacitor rails 1006 and the second trench capacitor rails 1008 are interleaved, and a high-K dielectric layer 1010 is disposed between adjacent rails to provide a high capacitance in the decoupling capacitor 1002. The first trench capacitor rails 1006 and the second trench capacitor rails 1008 are formed in a circuit cell area 1012 and an isolation region 1014 between the circuit cell area 1012 and a circuit cell area 1016. The first trench capacitor rails 1006 and the second trench capacitor rails 1008 are disposed in a metal layer 1022, a via layer 1024, and a metal layer 1026 in which a trench contact 1028 is formed. Forming the first trench capacitor rails 1006 and the second trench capacitor rails 1008 with a large Z-axis dimension increases a surface area between adjacent rails, thereby increasing capacitance. In addition, a larger Z-axis dimension increases cross-sectional area of the first trench capacitor rails 1006 and the second trench capacitor rails 1008 for a low resistance (e.g., to achieve a high Q factor). The decoupling capacitor 1002 is not limited to the first trench capacitor rails 1006 and the second trench capacitor rails 1008 illustrated in FIG. 10 and may include more or less than those shown.

With reference to FIG. 10, the decoupling capacitor 1002 includes the first trench capacitor rail 1006(1) extending in the X-axis direction. The first trench capacitor rail 1006 has a rail thickness $T_{1006}$ in the Z-axis direction extending between the metal layer 1022 and the metal layer 1026. The decoupling capacitor 1002 includes the second trench capacitor rail 1008 (1), also extending in the X-axis direction with a thickness $T_{1008}$ in the Z-axis direction. The decoupling capacitor 1002 includes a high-K dielectric layer 1027 between the first trench capacitor rail 1006(1) and the second trench capacitor rail 1008(1) in the metal layer 1022, the via layer 1024, and the metal layer 1026. A trench contact 1028 extends in the Y-axis direction in the metal layer 1026 and couples the first trench capacitor rail 1006(1) to a first trench power rail (see FIG. 8), providing one of the supply voltage $V_{DD}$ and the reference voltage $V_{SS}$. A second trench contact (not shown in FIG. 10 but can be understood in view of FIG. 8) also extends in the Y-axis direction in the metal layer 1026 and couples the second trench capacitor rail 1008(1) to a trench power rail providing the other one of the supply voltage $V_{DD}$ and the reference voltage $V_{SS}$.

In some examples, the decoupling capacitor 1002 further includes another first trench capacitor rail 1006(2) between the first trench capacitor rail 1006(1) and the second trench capacitor rail 1008(1). The first trench capacitor rail 1006(2) is coupled to the second trench contact (not shown). The decoupling capacitor 1002 also includes another second trench capacitor rail 1008(2) between the first trench capacitor rail 1006(1) and the other first trench capacitor rail 1006(2). The other second trench capacitor rail 1008(2) is coupled to the trench contact 1028. A high-K dielectric layer 1030 is disposed between the other first trench capacitor rail 1006(2) and the second trench capacitor rail 1008(2), and a high-K dielectric layer 1032 is disposed between the other first trench capacitor rail 1006(2) and the second trench capacitor rail 1008(1). In these examples, the high-K dielectric layer 1027 is disposed between the first trench capacitor rail 1006(1) and the other second trench capacitor rail 1008(2). In addition, a high-K dielectric layer 1034 is disposed between the other first trench capacitor rail 1006(1) and the not shown second trench contact, and a high-K dielectric layer 1036 is disposed between the other second trench capacitor rail 1008(1) and the trench contact 1028.

Figure 11:
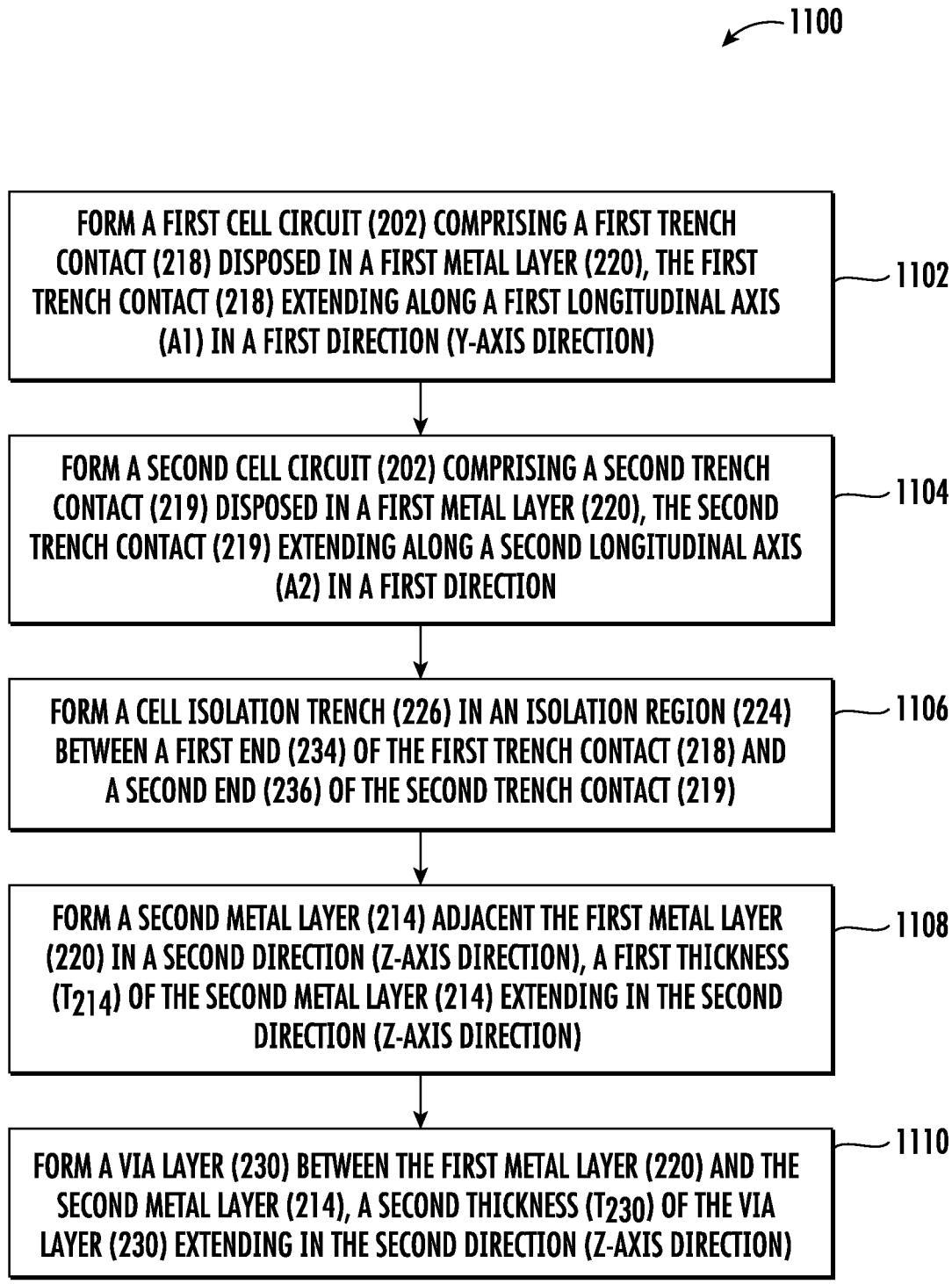
FIG. 11 is a flowchart illustrating a method of fabricating the IC shown in FIG. 2B.

FIG. 11 is a flowchart illustrating a method of manufacturing the IC 200 in FIGS. 2A and 2B. The method includes forming a first cell circuit 202 comprising a first trench contact 218 disposed in a first metal layer 220, the first trench contact 218 extending along a first longitudinal axis A1 in a first direction (Y-axis direction) (block 1102). The method further includes forming a second cell circuit 204 comprising a second trench contact 219 disposed in the first metal layer 220, the second trench contact 219 extending along a second longitudinal axis A2 in the first direction (block 1104). The method further includes forming a cell isolation trench 226 in an isolation region 224 between a first end 234 of the first trench contact 218 and a second end 236 of the second trench contact 219 (block 1106). The method further includes forming a second metal layer 214 adjacent the first metal layer 220 in a second direction (Z-axis direction), a first thickness $T_{214}$ of the second metal layer 214 extending in the second direction (Z-axis direction) (block 1108). The method includes forming a via layer 230 between the first metal layer 220 and the second metal layer 214, a second thickness $T_{230}$ of the via layer 230 extending in the second direction (Z-axis direction) (block 1110). The method still further includes forming a trench power rail 222 extending along a third longitudinal axis A3 in a third direction (X-axis), a thickness $T_{222}$ of the trench power rail comprising the first thickness $T_{214}$ of the second metal layer 214, the second thickness $T_{230}$ of the via layer 230, and a third thickness $T_{220}$ in the first metal layer 220 in the isolation region 224.

FIGS. 12A-12E are cross-sectional side views in stages of manufacturing of the IC 200 in FIG. 2, and FIGS. 13A-13E are corresponding blocks of a flowchart describing the methods corresponding to the stages of manufacturing shown in FIGS. 12A-12E. Where features of FIGS. 12A-12E correspond to features of FIGS. 2A and 2B, such features of FIGS. 12A-12E are labeled as in FIGS. 2A and 2B.

FIG. 12A is a cross-sectional side view in a first stage of fabrication of cell circuits 202, 204 showing sacrificial placeholders 1202 for the signal interconnects 212 in the metal layer 214 and vias 216. A process for forming the first cell circuit 202 and the second cell circuit 204 includes forming at least one of the diffusion regions 206 on the semiconductor substrate 210 in the first circuit cell 202 and at least one of the diffusion regions on the semiconductor substrate 210 in the second circuit cell 204. The process further includes forming the first trench contact 218 on the diffusion region 206 in the first cell circuit 202 and the second trench contact 219 on the diffusion region 206 in the second cell circuit 204. The process further includes forming the ILD 248 on the semiconductor substrate 210, on the first trench contact 218, and on the second trench contact 219, where a thickness of the ILD 248 includes the thickness $T_{214}$ of the metal layer 214 and the thickness $T_{230}$ of the via layer 230. In FIG. 13A, the method of forming the sacrificial placeholders 1202 as shown in FIG. 12A, includes forming trench patterns 1204 in the ILD 248 corresponding to vias 216 in the via layer 230 and signal interconnects 212 in the metal layer 214 (block 1302). The method further includes filling the trench patterns 1204 with a sacrificial material 1206 (block 1304). The sacrificial material may be a soft mask, such as amorphous silicon, spin-on-carbon, or spinon-glass. The cell circuits 202, 204 include diffusion regions 206 and trench contacts 218, 219.

FIG. 12B is a cross-sectional side view in a second stage of fabrication in which a power rail trench 246 is formed for a trench power rail 222 in an isolation region 224 between cell circuits 202, 204, and a high-K dielectric layer 232 is formed in the power rail trench 246. In FIG. 13B, the method of forming a trench power rail 222 as shown in FIG. 12B further comprises forming the power rail trench 246 in the RLD 248, which comprises removing the ILD 248 in the cell isolation trench 226 in the second metal layer 220 between the end 234 of the first trench contact 218 and the end 236 of the second trench contact 219 (block 1306). The method further includes removing the ILD 248 in the via layer 230 and the first metal layer 214 in the isolation region to expose a first surface 238 of the first trench contact 218 and a second surface 240 of the second trench contact 219 (block 1308). The method further includes forming a high-K dielectric layer 232 in the power rail trench 246 (block 1310).

FIG. 12C is a cross-sectional side view in a third stage of fabrication in which the sacrificial placeholders 1202 are removed. In FIG. 13C, the method of forming a trench power rail 222 further includes, as shown in FIG. 12C, removing the sacrificial material 1206 from the trench patterns 1204 in the ILD 248 (block 1312).

FIG. 12D is a cross-sectional side view in a fourth stage of fabrication in which the high-K dielectric layer is patterned. In FIG. 13D, the method of the stage illustrated in FIG. 12D includes selectively removing the high-K dielectric layer 232 from the first surface 238 of the first trench contact 218 and the second surface 240 of the second trench contact 219 (block 1314). Selectively removing the high-K dielectric layer 232 from the first surface 238 of the first trench contact 218 and the second surface 240 of the second trench contact 219 may include any of:

1) removing the high-K dielectric layer 232 from the first surface 238 of the first trench contact 218 but not removing the high-K dielectric layer 232 from the second surface 240 of the second trench contact 219;
2) removing the high-K dielectric layer 232 from the first surface 238 of the first trench contact 218 and removing the high-K dielectric layer 232 from the second surface 240 of the second trench contact 219; and
3) not removing the high-K dielectric layer 232 from the first surface 238 of the first trench contact 218 and not removing the high-K dielectric layer 232 from the second surface 240 of the second trench contact 219.

Selectively removing the high-K dielectric layer 232 may include applying a mask (not shown) removing portions of the high-K dielectric layer 232 not covered by the mask.

FIG. 12E is a cross-sectional side view in a fifth stage of fabrication in which signal interconnects 212 and the trench power rail 222 are formed. In FIG. 13E, the method of forming the trench power rail 222, forming the via layer 230, and forming the second metal layer, as illustrated in FIG. 12E, includes disposing a metal 1208 in the power rail trench 246 and in each of the trench patterns 1204 in the ILD 248 (block 1316). Disposing the metal 1208 may involve applying a mask and performing a metallization in which a metal (e.g., copper) is formed or deposited in the power rail trench 246 and trench patterns 1204.

Figure 14:
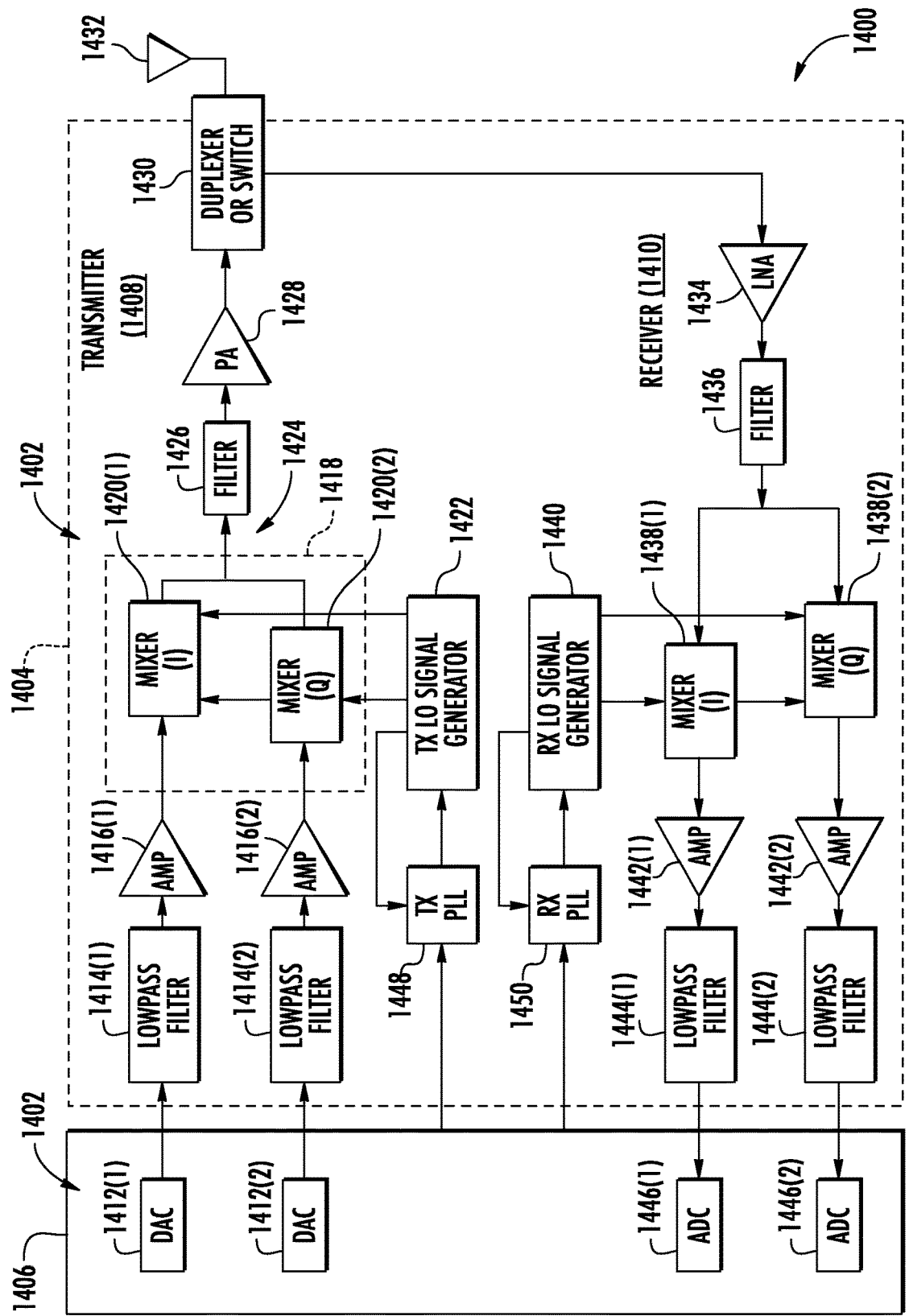
FIG. 14 is a block diagram of an exemplary wireless communications device that includes a radio frequency (RF) module including an IC including trench power rails with increased cross-section to reduce resistance and eliminate vias to the power rail, as illustrated in FIGS. 2A-7 and 12E.

FIG. 14 illustrates an exemplary wireless communications device 1400 that includes radio frequency (RF) components formed from one or more ICs 1402; any of the ICs 1402 can include trench power rails with increased cross-section to reduce resistance and eliminate vias to the power rail, as illustrated in FIGS. 2A-7 and 12E, and according to any of the aspects disclosed herein. The wireless communications device 1400 may include or be provided in any of the above-referenced devices, as examples. As shown in FIG. 14, the wireless communications device 1400 includes a transceiver 1404 and a data processor 1406. The data processor 1406 may include a memory to store data and program codes. The transceiver 1404 includes a transmitter 1408 and a receiver 1410 that support bi-directional communications. In general, the wireless communications device 1400 may include any number of transmitters 1408 and/or receivers 1410 for any number of communication systems and frequency bands. All or a portion of the transceiver 1404 may be implemented on one or more analog ICs, RFICs, mixed-signal ICs, etc.

The transmitter 1408 or the receiver 1410 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 1400 in FIG. 14, the transmitter 1408 and the receiver 1410 are implemented with the direct-conversion architecture.

In the transmit path, the data processor 1406 processes data to be transmitted and provides I and Q analog output signals to the transmitter 1408. In the exemplary wireless communications device 1400, the data processor 1406 includes digital-to-analog converters (DACs) 1412(1), 1412(2) for converting digital signals generated by the data processor 1406 into the I and Q analog output signals, e.g., I and Q output currents, for further processing.

Within the transmitter 1408, lowpass filters 1414(1), 1414(2) filter the I and Q analog output signals, respectively, to remove undesired signals caused by the prior digital-to-analog conversion. Amplifiers (AMPs) 1416(1), 1416(2) amplify the signals from the lowpass filters 1414(1), 1414 (2), respectively, and provide I and Q baseband signals. An upconverter 1418 upconverts the I and Q baseband signals with I and Q transmit (TX) local oscillator (LO) signals from a TX LO signal generator 1422 through mixers 1420(1), 1420(2) to provide an upconverted signal 1424. A filter 1426 filters the upconverted signal 1424 to remove undesired signals caused by the frequency upconversion as well as noise in a receive frequency band. A power amplifier (PA) 1428 amplifies the upconverted signal 1424 from the filter 1426 to obtain the desired output power level and provides a transmit RF signal. The transmit RF signal is routed through a duplexer or switch 1430 and transmitted via an antenna 1432.

In the receive path, the antenna 1432 receives signals transmitted by base stations and provides a received RF signal, which is routed through the duplexer or switch 1430 and provided to a low noise amplifier (LNA) 1434. The duplexer or switch 1430 is designed to operate with a specific receive (RX)-to-TX duplexer frequency separation, such that RX signals are isolated from TX signals. The received RF signal is amplified by the LNA 1434 and filtered by a filter 1436 to obtain a desired RF input signal. Down-conversion mixers 1438(1), 1438(2) mix the output of the filter 1436 with I and Q RX LO signals (i.e., LO_I and LO_Q) from an RX LO signal generator 1440 to generate I and Q baseband signals. The I and Q baseband signals are amplified by AMPs 1442(1), 1442(2) and further filtered by lowpass filters 1444(1), 1444(2) to obtain I and Q analog input signals, which are provided to the data processor 1406. In this example, the data processor 1406 includes analog-to-digital converters (ADCs) 1446(1), 1446(2) for converting the analog input signals into digital signals to be further processed by the data processor 1406.

In the wireless communications device 1400 of FIG. 14, the TX LO signal generator 1422 generates the I and Q TX LO signals used for frequency upconversion, while the RX LO signal generator 1440 generates the I and Q RX LO signals used for frequency downconversion. Each LO signal is a periodic signal with a particular fundamental frequency. A TX phase-locked loop (PLL) circuit 1448 receives timing information from the data processor 1406 and generates a control signal used to adjust the frequency and/or phase of the TX LO signals from the TX LO signal generator 1422. Similarly, an RX PLL circuit 1450 receives timing information from the data processor 1406 and generates a control signal used to adjust the frequency and/or phase of the RX LO signals from the RX LO signal generator 1440.

Wireless communications devices 1400 that can each include an IC including trench power rails with increased cross-section to reduce resistance and eliminate vias to the power rail, as illustrated in FIGS. 2A-7 and 12E, and according to any of the aspects disclosed herein, may be provided in or integrated into any processor-based device. Examples, without limitation, include a set-top box, an entertainment unit, a navigation device, a communications device, a fixed location data unit, a mobile location data unit, a global positioning system (GPS) device, a mobile phone, a cellular phone, a smartphone, a session initiation protocol (SIP) phone, a tablet, a phablet, a server, a computer, a portable computer, a mobile computing device, a wearable computing device (e.g., a smartwatch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 15:
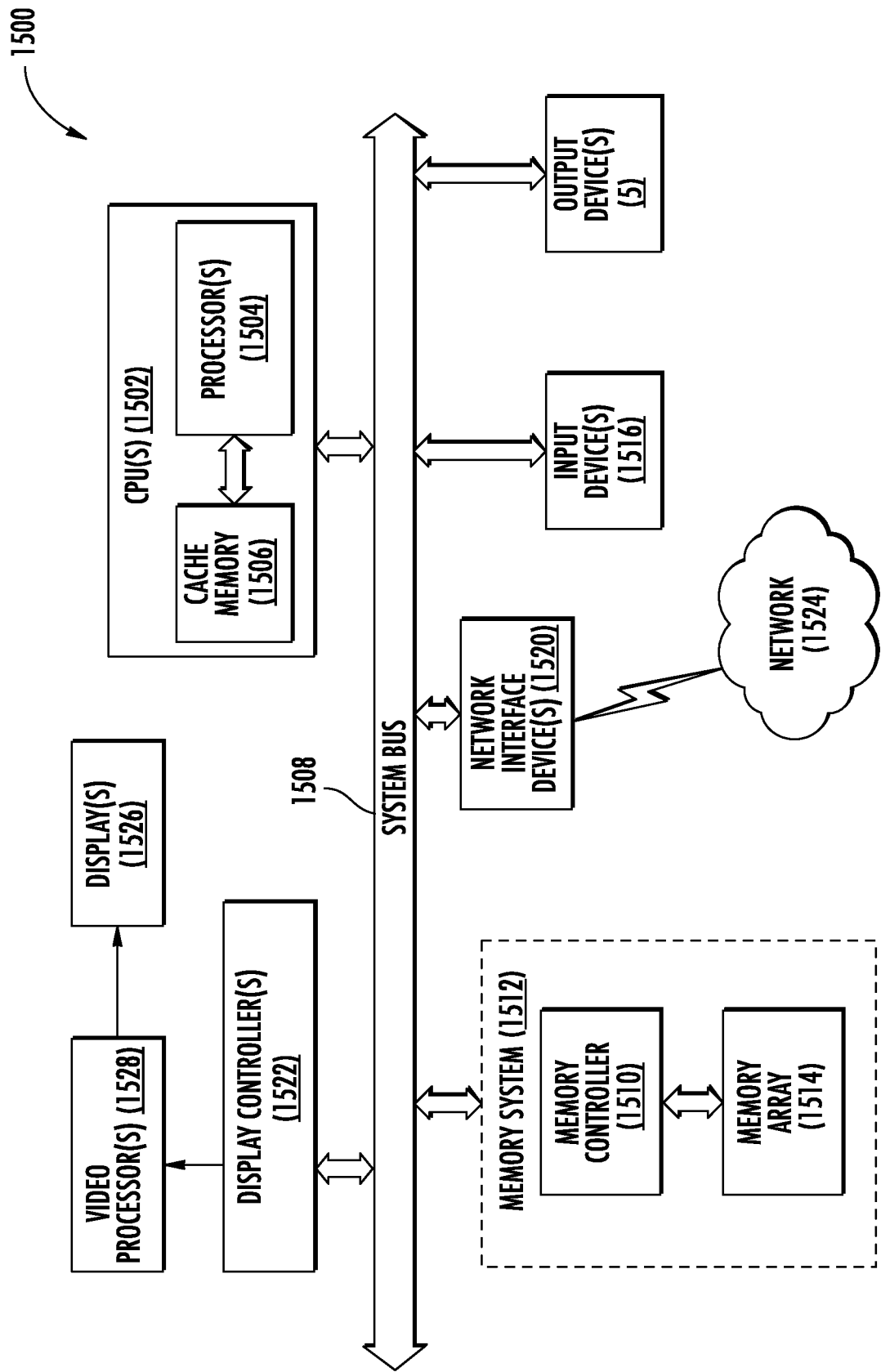
FIG. 15 is a block diagram of an exemplary processor-based system that can include an IC including trench power rails with increased cross-sectional area to reduce resistance and eliminate vias, as illustrated in FIGS. 2A-7 and 12E, and according to any of the aspects disclosed herein.

In this regard, FIG. 15 illustrates an example of a processor-based system 1500 including an IC including 3D power rails with increased cross-section to reduce resistance and eliminate vias to the power rail, as illustrated in FIGS. 2A-7 and 12E, and according to any aspects disclosed herein. In this example, the processor-based system 1500 includes one or more central processor units (CPUs) 1502, which may also be referred to as CPU or processor cores, each including one or more processors 1504. The CPU(s) 1502 may have cache memory 1506 coupled to the processor(s) 1504 for rapid access to temporarily stored data. The CPU(s) 1502 is coupled to a system bus 1508 and can intercouple master and slave devices included in the processor-based system 1500. As is well known, the CPU(s) 1502 communicates with these other devices by exchanging address, control, and data information over the system bus 1508. For example, the CPU(s) 1502 can communicate bus transaction requests to a memory controller 1510 as an example of a slave device. Although not illustrated in FIG. 15, multiple system buses 1508 could be provided, wherein each system bus 1508 constitutes a different fabric.

Other master and slave devices can be connected to the system bus 1508. As illustrated in FIG. 15, these devices can include a memory system 1512 that includes the memory controller 1510 and one or more memory arrays 1514, one or more input devices 1516, one or more output devices 1518, one or more network interface devices 1520, and one or more display controllers 1522, as examples. Any of the output devices 1518 and the network interface devices 1520 can include an IC including trench power rails with increased cross-section to reduce resistance and eliminate vias to the power rail, as illustrated in FIGS. 2A-7 and 12E, and according to any of the aspects disclosed herein. The input device(s) 1516 can include any type of input device, including, but not limited to, input keys, switches, voice processors, etc. The output device(s) 1518 can include any type of output device, including, but not limited to, audio, video, other visual indicators, etc. The network interface device(s) 1520 can be any device configured to allow an exchange of data to and from a network 1524. The network 1524 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1520 can be configured to support any type of communications protocol desired.

The CPU(s) 1502 may also be configured to access the display controller(s) 1522 over the system bus 1508 to control information sent to one or more displays 1526. The display controller(s) 1522 sends information to the display(s) 1526 to be displayed via one or more video processors 1528, which process the information to be displayed into a format suitable for the display(s) 1526. The display(s) 1526 can include any type of display, including, but not limited to, a cathode ray tube (CRT), a liquid crystal display (LCD), a plasma display, a light-emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware and may reside, for example, in Random Access Memory (RAM), flash memory, Read-Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from and write information to the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

Implementation examples are described in the following numbered clauses:

1. An integrated circuit (IC), comprising:
    a first cell circuit comprising a first trench contact disposed in a first metal layer, the first trench contact extending along a first longitudinal axis in a first direction;
    a second cell circuit comprising a second trench contact disposed in the first metal layer, the second trench contact extending along a second longitudinal axis in the first direction;
    a cell isolation trench in an isolation region between a first end of the first trench contact and a second end of the second trench contact;
    a second metal layer adjacent the first metal layer in a second direction, a first thickness of the second metal layer extending in the second direction;
    a via layer between the first metal layer and the second metal layer, a second thickness of the via layer extending in the second direction; and
    a trench power rail in the cell isolation trench, the trench power rail extending along a third longitudinal axis in a third direction, a thickness of the trench power rail comprising the first thickness of the second metal layer, the second thickness of the via layer, and a third thickness in the first metal layer.
2. The IC of clause 1, wherein:
    the first longitudinal axis is colinear with the second longitudinal axis; and
    the trench power rail disposed between the first end of the first trench contact and the second end of the second trench contact comprises a first width in the first direction less than or equal to a tip-to-tip distance between the first end of the first trench contact and the second end of the second trench contact.
3. The IC of clause 2, wherein:
    the first trench contact comprises a first surface adjacent to the via layer;
    the second trench contact comprises a second surface adjacent to the via layer,
    a second width of the trench power rail in the first direction in the via layer is greater than the tip-to-tip distance; and
    the trench power rail is on the first surface and on the second surface.
4. The IC of clause 3, wherein the trench power rail comprises the second width in the first direction in the second metal layer.
5. The IC of any of clause 3 to clause 4, wherein the trench power rail is in direct contact with the first trench contact and separated from the second trench contact by a dielectric layer.
6. The IC of any of clause 3 to clause 4, wherein the trench power rail is in direct contact with the first trench contact and the second trench contact.
7. The IC of any of clause 3 to clause 4, wherein the trench power rail is separated from the first trench contact by a dielectric layer and separated from the second trench contact by the dielectric layer.
8. The IC of any of clause 1 to clause 7, wherein the trench power rail comprises a monolithic metal layer.
9. The IC of any of clause 1 to clause 8, wherein:
    the first cell circuit further comprises a first diffusion region of a first transistor, and the first diffusion region is directly coupled to the first trench contact; and
    the second cell circuit further comprises a second diffusion region of a second transistor, and the second diffusion region is directly coupled to the second trench contact.
10. An integrated circuit (IC), comprising:
    a first power rail and a second power rail each extending in a first direction in a first metal layer, and
    a decoupling capacitor comprising:
        a first trench capacitor rail extending in the first direction;
        a second trench capacitor rail extending in the first direction adjacent to the first trench capacitor rail;
        a first dielectric layer disposed between the first trench capacitor rail and the second trench capacitor rail;
        a first trench contact extending in a second direction in the first metal layer and coupling the first trench capacitor rail to the first power rail; and a second trench contact extending in the second direction in the first metal layer and coupling the second trench capacitor rail to the second power rail.

11. The IC of clause 10, the decoupling capacitor further comprising:
a third trench capacitor rail extending in the first direction, the third trench capacitor rail disposed between the first trench capacitor rail and the second trench capacitor rail and coupled to the second trench contact;
a fourth trench capacitor rail extending in the first direction, the fourth trench capacitor rail disposed between the third trench capacitor rail and the second trench capacitor rail and coupled to the first trench contact;
a second dielectric layer disposed between the third trench capacitor rail and the fourth trench capacitor rail; and
a third dielectric layer disposed between the fourth trench capacitor rail and the second trench capacitor rail;
wherein the first dielectric layer is disposed between the first trench capacitor rail and the third trench capacitor rail.

12. The IC of any of clause 10 to clause 11, wherein the decoupling capacitor is disposed between the first power rail and the second power rail.

13. A method of manufacturing an integrated circuit (IC), the method comprising:
forming a first cell circuit comprising a first trench contact disposed in a first metal layer, the first trench contact extending along a first longitudinal axis in a first direction;
forming a second cell circuit comprising a second trench contact disposed in the first metal layer, the second trench contact extending along a second longitudinal axis in the first direction;
forming a cell isolation trench in an isolation region between a first end of the first trench contact and a second end of the second trench contact;
forming a second metal layer adjacent the first metal layer in a second direction, a first thickness of the second metal layer extending in the second direction;
forming a via layer between the first metal layer and the second metal layer, a second thickness of the via layer extending in the second direction; and
forming a trench power rail in the cell isolation trench, the trench power rail extending along a third longitudinal axis in a third direction, a thickness of the trench power rail comprising the first thickness of the second metal layer, the second thickness of the via layer, and a third thickness in the first metal layer.

14. The method of clause 13, wherein forming the first cell circuit and the second cell circuit further comprises:
forming a first diffusion region on a semiconductor substrate;
forming a second diffusion region on the semiconductor substrate;
forming the first trench contact on the first diffusion region;
forming the second trench contact on the second diffusion region;
forming an inter-layer dielectric (ILD) on the semiconductor substrate, on the first trench contact, and on the second trench contact;
forming trench patterns in the ILD corresponding vias in the via layer and signal interconnects in the second metal layer; and
filling the trench patterns with sacrificial material.

15. The method of clause 14, wherein forming the trench power rail further comprises:
removing the ILD in the isolation region in the second metal layer; and
removing the LD in the via layer and in the first metal layer in the isolation region to expose a first surface of the first trench contact and a second surface of the second trench contact; and
forming a dielectric layer for the trench power rail.

16. The method of clause 15, further comprising:
removing the sacrificial material from the trench patterns in the ILD; and
selectively removing the dielectric layer from the exposed first surface of the first trench contact and the exposed second surface of the second trench contact.

17. The method of clause 16, wherein selectively removing the dielectric layer from the exposed first surface of the first trench contact and the exposed second surface of the second trench contact further comprises removing the dielectric layer from the exposed first surface of the first trench contact but not removing the dielectric layer from the exposed second surface of the second trench contact.

18. The method of clause 16, wherein selectively removing the dielectric layer from the exposed first surface of the first trench contact and the exposed second surface of the second trench contact further comprises removing the dielectric layer from the exposed first surface of the first trench contact and removing the dielectric layer from the exposed second surface of the second trench contact.

19. The method of clause 16, wherein selectively removing the dielectric layer from the exposed first surface of the first trench contact and the exposed second surface of the second trench contact further comprises not removing the dielectric layer from the exposed first surface of the first trench contact and not removing the dielectric layer from the exposed second surface of the second trench contact.

What is claimed is:
1. An integrated circuit (IC), comprising:
a first cell circuit comprising a first trench contact disposed in a first metal layer, the first trench contact extending along a first longitudinal axis in a first direction;
a second cell circuit comprising a second trench contact disposed in the first metal layer, the second trench contact extending along a second longitudinal axis in the first direction;
a cell isolation trench in an isolation region between a first end of the first trench contact and a second end of the second trench contact;
a second metal layer adjacent the first metal layer in a second direction, a first thickness of the second metal layer extending in the second direction;
a via layer between the first metal layer and the second metal layer, a second thickness of the via layer extending in the second direction; and
a trench power rail in the cell isolation trench, the trench power rail extending along a third longitudinal axis in a third direction, a thickness of the trench power rail comprising the first thickness of the second metal layer, the second thickness of the via layer, and a third thickness in the first metal layer.

2. The IC of claim 1, wherein:
the first longitudinal axis is colinear with the second longitudinal axis; and
the trench power rail disposed between the first end of the first trench contact and the second end of the second trench contact comprises a first width in the first direction less than or equal to a tip-to-tip distance between the first end of the first trench contact and the second end of the second trench contact.

3. The IC of claim 2, wherein:
the first trench contact comprises a first surface adjacent to the via layer;
the second trench contact comprises a second surface adjacent to the via layer;
a second width of the trench power rail in the first direction in the via layer is greater than the tip-to-tip distance; and
the trench power rail is on the first surface and on the second surface.

4. The IC of claim 3, wherein the trench power rail comprises the second width in the first direction in the second metal layer.

5. The IC of claim 3, wherein the trench power rail is in direct contact with the first trench contact and separated from the second trench contact by a dielectric layer.

6. The IC of claim 3, wherein the trench power rail is in direct contact with the first trench contact and the second trench contact.

7. The IC of claim 3, wherein the trench power rail is separated from the first trench contact by a dielectric layer and separated from the second trench contact by the dielectric layer.

8. The IC of claim 1, wherein the trench power rail comprises a monolithic metal layer.

9. The IC of claim 1, wherein:
the first cell circuit further comprises a first diffusion region of a first transistor, and the first diffusion region is directly coupled to the first trench contact; and
the second cell circuit further comprises a second diffusion region of a second transistor, and the second diffusion region is directly coupled to the second trench contact.

10. An integrated circuit (IC), comprising:
a first power rail and a second power rail each extending in a first direction in a first metal layer; and
a decoupling capacitor comprising:
a first trench capacitor rail extending in the first direction;
a second trench capacitor rail extending in the first direction adjacent to the first trench capacitor rail;
a first dielectric layer disposed between the first trench capacitor rail and the second trench capacitor rail;
a first trench contact extending in a second direction in the first metal layer and coupling the first trench capacitor rail to the first power rail; and
a second trench contact extending in the second direction in the first metal layer and coupling the second trench capacitor rail to the second power rail.

11. The IC of claim 10, the decoupling capacitor further comprising:
a third trench capacitor rail extending in the first direction, the third trench capacitor rail disposed between the first trench capacitor rail and the second trench capacitor rail and coupled to the second trench contact;

a fourth trench capacitor rail extending in the first direction, the fourth trench capacitor rail disposed between the first trench capacitor rail and the second trench capacitor rail and coupled to the first trench contact;
a second dielectric layer disposed between the third trench capacitor rail and the fourth trench capacitor rail; and
a third dielectric layer disposed between the fourth trench capacitor rail and the second trench capacitor rail;
wherein the first dielectric layer is disposed between the first trench capacitor rail and the third trench capacitor rail.

12. The IC of claim 10, wherein the decoupling capacitor is disposed between the first power rail and the second power rail.

13. A method of manufacturing an integrated circuit (IC), the method comprising:
forming a first cell circuit comprising a first trench contact disposed in a first metal layer, the first trench contact extending along a first longitudinal axis in a first direction;
forming a second cell circuit comprising a second trench contact disposed in the first metal layer, the second trench contact extending along a second longitudinal axis in the first direction;
forming a cell isolation trench in an isolation region between a first end of the first trench contact and a second end of the second trench contact;
forming a second metal layer adjacent the first metal layer in a second direction, a first thickness of the second metal layer extending in the second direction;
forming a via layer between the first metal layer and the second metal layer, a second thickness of the via layer extending in the second direction; and
forming a trench power rail in the cell isolation trench, the trench power rail extending along a third longitudinal axis in a third direction, a thickness of the trench power rail comprising the first thickness of the second metal layer, the second thickness of the via layer, and a third thickness in the first metal layer.

14. The method of claim 13, wherein forming the first cell circuit and the second cell circuit further comprises:
forming a first diffusion region on a semiconductor substrate;
forming a second diffusion region on the semiconductor substrate;
forming the first trench contact on the first diffusion region;
forming the second trench contact on the second diffusion region;
forming an inter-layer dielectric (ILD) on the semiconductor substrate, on the first trench contact, and on the second trench contact;
forming trench patterns in the ILD corresponding vias in the via layer and signal interconnects in the second metal layer; and
filling the trench patterns with sacrificial material.

15. The method of claim 14, wherein forming the trench power rail further comprises:
removing the ILD in the isolation region in the second metal layer; and
removing the ILD in the via layer and in the first metal layer in the isolation region to expose a first surface of the first trench contact and a second surface of the second trench contact; and
forming a dielectric layer for the trench power rail.

16. The method of claim 15, further comprising:
- removing the sacrificial material from the trench patterns in the ILD; and
- selectively removing the dielectric layer from the exposed first surface of the first trench contact and the exposed second surface of the second trench contact.

17. The method of claim 16, wherein selectively removing the dielectric layer from the exposed first surface of the first trench contact and the exposed second surface of the second trench contact further comprises removing the dielectric layer from the exposed first surface of the first trench contact but not removing the dielectric layer from the exposed second surface of the second trench contact.

18. The method of claim 16, wherein selectively removing the dielectric layer from the exposed first surface of the first trench contact and the exposed second surface of the second trench contact further comprises removing the dielectric layer from the exposed first surface of the first trench contact and removing the dielectric layer from the exposed second surface of the second trench contact.

19. The method of claim 16, wherein selectively removing the dielectric layer from the exposed first surface of the first trench contact and the exposed second surface of the second trench contact further comprises not removing the dielectric layer from the exposed first surface of the first trench contact and not removing the dielectric layer from the exposed second surface of the second trench contact.

* * * * *